(12) United States Patent
Gao et al.

(10) Patent No.: US 12,417,740 B2
(45) Date of Patent: Sep. 16, 2025

(54) DISPLAY SUBSTRATE AND DRIVING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Wenhui Gao, Beijing (CN); Yunsheng Xiao, Beijing (CN); Tiaomei Zhang, Beijing (CN); Zhiliang Jiang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/696,352

(22) PCT Filed: Aug. 19, 2022

(86) PCT No.: PCT/CN2022/113727
§ 371 (c)(1),
(2) Date: Mar. 27, 2024

(87) PCT Pub. No.: WO2024/036629
PCT Pub. Date: Feb. 22, 2024

(65) Prior Publication Data
US 2024/0412688 A1 Dec. 12, 2024

(51) Int. Cl.
*G09G 3/3233* (2016.01)
*H10K 59/121* (2023.01)
*H10K 59/131* (2023.01)

(52) U.S. Cl.
CPC ....... *G09G 3/3233* (2013.01); *H10K 59/1213* (2023.02); *H10K 59/1216* (2023.02);
(Continued)

(58) Field of Classification Search
CPC ......... G09G 3/3233; G09G 2300/0426; G09G 2300/0852; G09G 2310/08;
(Continued)

(56) References Cited

U.S. PATENT DOCUMENTS

| | | | |
|---|---|---|---|
| 2017/0124946 A1 | 5/2017 | Wu et al. | |
| 2023/0410745 A1* | 12/2023 | Guo | G09G 3/3233 |
| 2023/0413629 A1* | 12/2023 | Yuan | H10K 59/131 |

FOREIGN PATENT DOCUMENTS

| | | |
|---|---|---|
| CN | 110895915 A | 3/2020 |
| CN | 112086071 A | 12/2020 |

(Continued)

OTHER PUBLICATIONS

International Search Report for PCT/CN2022/113727 Mailed Dec. 28, 2022.

*Primary Examiner* — Adam R. Giesy
(74) *Attorney, Agent, or Firm* — Ling Wu; Stephen Yang; Ling and Yang Intellectual Property

(57) ABSTRACT

A display substrate and a driving method therefor, and a display device. The display substrate comprises a plurality of circuit units, at least one circuit unit comprising a pixel driving circuit, which at least comprises a compensation transistor, a driving transistor, a data writing transistor, a first storage capacitor, and a second storage capacitor, wherein a gate electrode of the data writing transistor is connected to a first scan signal line; a gate electrode of the compensation transistor is connected to a second scan signal line; a first end of the first storage capacitor is connected to a gate electrode of the driving transistor; a first end of the second storage capacitor is connected to a first electrode of the driving transistor; and a second end of the first storage capacitor and a second end of the second storage capacitor are connected to a first power line.

17 Claims, 15 Drawing Sheets

(52) U.S. Cl.
CPC . *H10K 59/1315* (2023.02); *G09G 2300/0426* (2013.01); *G09G 2300/0852* (2013.01); *G09G 2310/08* (2013.01); *G09G 2320/0233* (2013.01); *G09G 2330/023* (2013.01)

(58) Field of Classification Search
CPC ..... G09G 2320/0233; G09G 2330/023; G09G 3/32; H10K 59/1213; H10K 59/1216; H10K 59/1315; H10K 59/131
See application file for complete search history.

(56) References Cited

FOREIGN PATENT DOCUMENTS

| | | | |
|---|---|---|---|
| CN | 112349864 | A | 2/2021 |
| CN | 112968050 | A | 6/2021 |
| CN | 113178163 | A | 7/2021 |
| CN | 113690306 | A | 11/2021 |
| CN | 113745253 | A | 12/2021 |
| CN | 114023266 | A | 2/2022 |
| CN | 114361228 | A | 4/2022 |
| CN | 114708832 | A | 7/2022 |
| CN | 114730538 | A | 7/2022 |
| CN | 114784082 | A | 7/2022 |

\* cited by examiner

DISPLAY SUBSTRATE AND DRIVING METHOD THEREFOR, AND DISPLAY DEVICE

CROSS-REFERENCE TO RELATED APPLICATION

The present application is a U.S. National Phase Entry of International Application No. PCT/CN2022/113727 having an international filing date of Aug. 19, 2022, the content of which is hereby incorporated by reference.

TECHNICAL FIELD

The present disclosure relates to, but is not limited to, the field of display technologies, and particularly to a display substrate and a driving method for the display substrate, and a display device.

BACKGROUND

An Organic Light Emitting Diode (OLED) and a Quantum dot Light Emitting Diode (QLED) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matters described herein in detail. The summary is not intended to limit the scope of protection of the claims.

In one aspect, the present disclosure provides a display substrate. The display substrate includes multiple circuit units constituting multiple unit rows and multiple unit columns, at least one circuit unit includes a pixel drive circuit, the pixel drive circuit at least includes a compensation transistor, a drive transistor, a data writing transistor, a first node, a second node, a first storage capacitor and a second storage capacitor, and the pixel drive circuit is connected with a first scan signal line, a second scan signal line, a first power supply line and a data signal line, respectively; a gate electrode of the drive transistor is connected with the second node, a first electrode of the drive transistor is connected with the first node, and a second electrode of the drive transistor is connected with a second electrode of the compensation transistor; a gate electrode of the data writing transistor is connected with the first scan signal line, a first electrode of the data writing transistor is connected with the data signal line, and a second electrode of the data writing transistor is connected with the first node; a gate electrode of the compensation transistor is connected with the second scan signal line, and a first electrode of the compensation transistor is connected with the second node; a first end of the first storage capacitor is connected with the second node, and a second end of the first storage capacitor is connected with the first power supply line; a first end of the second storage capacitor is connected with the first node, and a second end of the second storage capacitor is connected with the first power supply line.

In an exemplary implementation, on a plane perpendicular to the display substrate, the display substrate includes a semiconductor layer, a first conductive layer, a second conductive layer, and a third conductive layer disposed sequentially on a base substrate; the first end of the first storage capacitor includes a first electrode plate, the second end of the first storage capacitor includes a second electrode plate, the first electrode plate is disposed in the first conductive layer, and a second electrode plate is disposed in the second conductive layer; the first end of the second storage capacitor at least includes a third electrode plate, the second end of the second storage capacitor includes a fourth electrode plate, the third electrode plate is disposed in the semiconductor layer, and the fourth electrode plate is disposed in the second conductive layer.

In an exemplary implementation, the first end of the second storage capacitor further includes a fifth electrode plate, the fifth electrode plate is disposed in the third conductive layer, and the third electrode plate is connected with the fifth electrode plate.

In an exemplary implementation, on a plane perpendicular to the display substrate, the display substrate includes a semiconductor layer, a first conductive layer, a second conductive layer, and a third conductive layer disposed sequentially on a base substrate; the first end of the first storage capacitor includes a first electrode plate, the second end of the first storage capacitor includes a second electrode plate, the first electrode plate is disposed in the first conductive layer, and a second electrode plate is disposed in the second conductive layer; the first end of the second storage capacitor at least includes a fifth electrode plate, the second end of the second storage capacitor includes a fourth electrode plate, the fifth electrode plate is disposed in the third conductive layer, and the fourth electrode plate is disposed in the second conductive layer.

In an exemplary implementation, the semiconductor layer further includes an active layer of the drive transistor and the third electrode plate and the active layer of the drive transistor are an interconnected integral structure.

In an exemplary implementation, the second electrode plate and the fourth electrode plate are an interconnected integral structure.

In an exemplary implementation, the first node is disposed in the third conductive layer, the first node and the fifth electrode plate are an interconnected integral structure, and the first node is connected with the third electrode plate through a via.

In an exemplary embodiment, on a plane perpendicular to the display substrate, the display substrate includes a semiconductor layer, a first conductive layer, a second conductive layer, and a third conductive layer disposed sequentially on a base substrate; the first end of the first storage capacitor includes a first electrode plate, the second end of the first storage capacitor includes a second electrode plate, the first electrode plate is disposed in the first conductive layer, and the second electrode plate is disposed in the second conductive layer; the first end of the second storage capacitor includes a third electrode plate, the second end of the second storage capacitor includes a fourth electrode plate, the third electrode plate is disposed in the first conductive layer, and the fourth electrode plate is disposed in the second conductive layer.

In an exemplary implementation, the second conductive layer further includes a first electrode plate connection block, and the second electrode plate and the fourth electrode plate are connected with each other through the first electrode plate connection block.

In an exemplary implementation, the third conductive layer further includes a second electrode plate connection block and the first node, the first node is connected with the second electrode plate connection block, the second electrode plate connection block is connected with the third electrode plate through a via.

In an exemplary implementation, a spacing between the first electrode plate and the third electrode plate is greater than or equal to 2 μm, and the spacing is a dimension in a direction of a unit row.

In an exemplary implementation, a capacitance value of the second storage capacitor is less than a capacitance value of the first storage capacitor.

In an exemplary implementation, a capacitance value of the second storage capacitor is 20% to 70% of the capacitance value of the first storage capacitor.

In an exemplary implementation, the pixel drive circuit is further connected with a first initial signal line and a second initial signal line respectively, shapes of the first initial signal line and the second initial signal line are line shapes extending along a first direction; the first initial signal line is connected with a first connection line extending along a second direction to form a mesh structure for transmitting a first initial signal, the second initial signal line is connected with a second connection line extending along the second direction to form a mesh structure for transmitting a second initial signal, and the first direction intersects with the second direction.

In an exemplary implementation, the first initial signal line and the second initial signal line are disposed in circuit units of at least one unit row; first connection lines are disposed in circuit units of odd-numbered unit columns, and second connection lines are disposed in circuit units of even-numbered unit columns, or first connection lines are disposed in circuit units of even-numbered unit columns and second connection lines are disposed in circuit units of odd-numbered unit columns.

In an exemplary implementation, on a plane perpendicular to the display substrate, the display substrate includes a first conductive layer, a second conductive layer, a third conductive layer, and a fourth conductive layer disposed sequentially on a base substrate; the first initial signal line and the second initial signal line are disposed in the second conductive layer, and the first connection line and the second connection line are disposed in the fourth conductive layer.

In an exemplary implementation, the third conductive layer in at least one circuit unit further includes a first initial electrode, the first connection line is connected with the first initial electrode through a via, and the first initial electrode is connected with the first initial signal line through a via.

In an exemplary implementation, the third conductive layer in at least one circuit unit further includes a second initial electrode, the second connection line is connected with the second initial electrode through a via, and the second initial electrode is connected with the second initial signal line through a via.

In an exemplary implementation, the display substrate further includes a fifth conductive layer disposed on a side of the fourth conductive layer away from the base substrate, the data signal line is disposed in the fifth conductive layer, an orthographic projection of at least one data signal line on the base substrate is at least partially overlapped with an orthographic projection of the first connection line on the base substrate, and an orthographic projection of at least one data signal line on the base substrate is at least partially overlapped with an orthographic projection of the second connection line on the base substrate.

In another aspect, the present disclosure further provides a display device, including the display substrate described above.

In yet another aspect, the present disclosure further provides a method for driving the display substrate described above, including: during a data writing time stage, the first scan signal line and the second scan signal line output a turned-on signal, the compensation transistor and the data writing transistor are turned on, and a data voltage output by the data signal line is written into the first storage capacitor and the second storage capacitor; and during a threshold compensation time stage, the first scan signal line outputs a turned-off signal, the second scan signal line outputs a turned-on signal, the compensation transistor is turned on, the data writing transistor is turned off, the data voltage stored in the second storage capacitor is written into the first storage capacitor, and threshold compensation is performed on the drive transistor.

In an exemplary implementation, a time length of the threshold compensation time stage is greater than or equal to a time length of the data writing time stage.

In an exemplary implementation, the time length of the threshold compensation time stage is n times the time length of the data writing time stage, wherein n is a positive integer greater than or equal to 1 and less than or equal to 9.

After the drawings and the detailed descriptions are read and understood, the other aspects may be comprehended.

BRIEF DESCRIPTION OF DRAWINGS

The accompany drawings are used to provide further understanding of the technical solution of the present disclosure, and form a part of the specification. The accompany drawings and embodiments of the present disclosure are adopted to explain the technical solution of the present disclosure, and do not form limits to the technical solution of the present disclosure.

Figure 1:
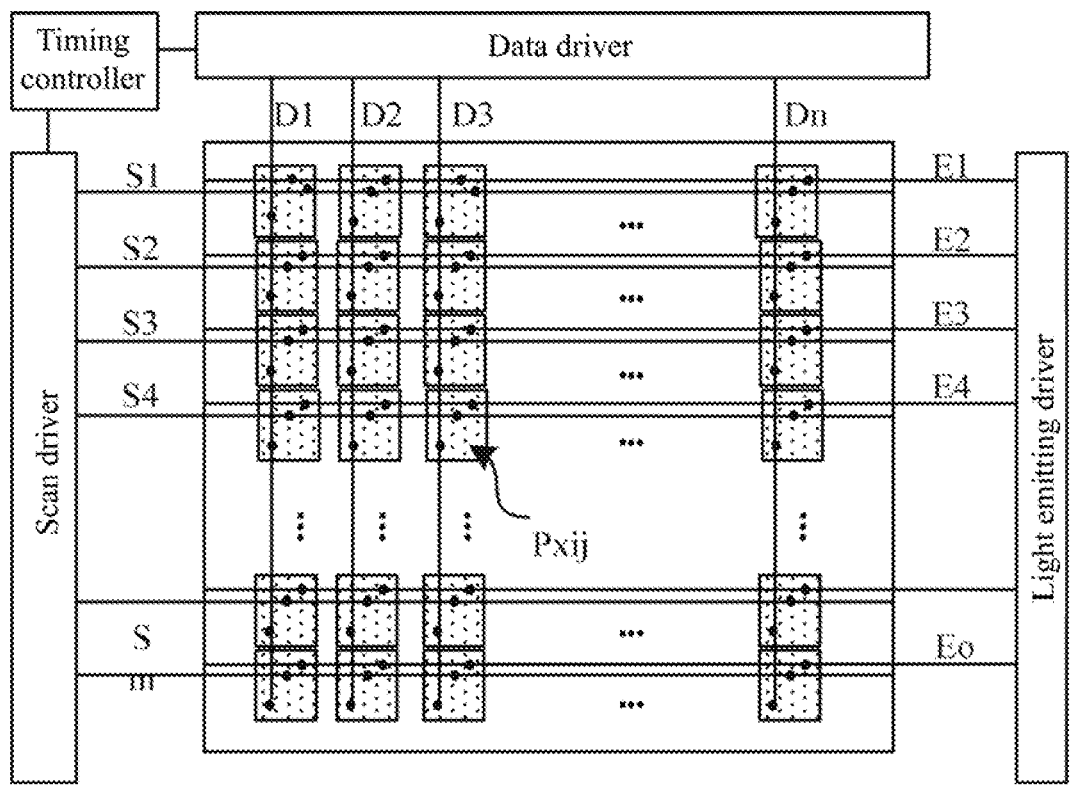
FIG. 1 is a schematic diagram of a structure of a display device.

Reference signs are described as follows.

10-first storage capacitor;
11-first active layer;
12-second active layer;
13-third active layer;
14-fourth active layer;
15-fifth active layer;
16-sixth active layer;
17-seventh active layer;
18-third electrode plate;
20-second storage capacitor;
21-first scan signal line;
22-second scan signal line
23-third scan signal line;
24-light emitting control line;
25-first electrode plate;
31-first initial signal line;
32-second initial signal line;
33-second electrode plate;
34-fourth electrode plate;
35-electrode plate connection line;
36-opening;

Reference signs are described as follows.

37-shielding electrode;
38-first electrode plate connection block;
41-first connection electrode;
42-second connection electrode;
43-third connection electrode;
44-fourth connection electrode;
45-fifth connection electrode;
46-sixth connection electrode;
47-seventh connection electrode;
48-fifth electrode plate;
49-second electrode plate connection block;
51-eleventh connection electrode;
52-twelfth connection electrode;
53-first power supply line;
61-data signal line;
62-anode connection electrode;
71-first initial electrode;
72-second initial electrode;
81-first connection line;
82-second connection line;
100-display area;
101-base substrate;
102-drive circuit layer;
103-light emitting structure layer;
104-encapsulation structure layer;
200-bonding area;
300-bezel area.

DETAILED DESCRIPTION

To make the objectives, technical solutions, and advantages of the present disclosure clearer, the embodiments of the present disclosure will be described in detail below in combination with the accompany drawings. It is to be noted that the implementations may be implemented in various forms. Those of ordinary skills in the art can easily understand such a fact that modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other in case of no conflicts.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals "first", "second", "third", etc., in the specification are set not to form limits in number but only to avoid the confusion of composition elements.

In the specification, for convenience, expressions "central", "above", "below", "front", "back", "vertical", "horizontal", "top", "bottom", "inside", "outside", etc., indicating directional or positional relationships are used to illustrate positional relationships between the composition elements, not to indicate or imply that involved devices or elements are required to have specific orientations and be structured and operated with the specific orientations but only to easily and simply describe the present specification, and thus should not be understood as limits to the present disclosure. The positional relationships between the composition elements may be changed as appropriate according to the direction where each composition element is described. Therefore, appropriate replacements based on situations are allowed, not limited to the expressions in the specification.

In the specification, unless otherwise specified and defined, terms "mounting", "mutual connection", and "connection" should be generally understood. For example, the term "connection" may be fixed connection, or detachable connection, or integral connection. The term may be mechanical connection or electric connection. The term may be direct connection, or indirect connection through an intermediate, or communication inside two elements. Those of ordinary skill in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source electrode. It is to be noted that in the specification, the channel region refers to a main area that a current flows through.

In the specification, a first electrode may be the drain electrode, and a second electrode may be the source electrode. Or, the first electrode may be a source electrode, and the second electrode may be a drain electrode. In cases that transistors with opposite polarities are used, or a current direction changes during work of a circuit, or the like, functions of the "source electrode" and the "drain electrode" may sometimes be exchanged. Therefore, the "source electrode" and the "drain electrode", as well as the "source terminal" and the "drain terminal", are interchangeable in the specification.

In the specification, "electric connection" includes connection of the composition elements through an element with a certain electric action. "An element with a certain electric action" is not particularly limited as long as electric signals between the connected composition elements may be sent and received. Examples of "an element with a certain electric action" not only include an electrode and a wiring, but also include a switch element such as a transistor, a resistor, an inductor, a capacitor, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within process and measurement error ranges are allowed.

FIG. 1 is a schematic diagram of a structure of a display device. As shown in FIG. 1, the display device may include a timing controller, a data driver, a scan driver, a light emitting driver, and a pixel array. The timing controller is connected with the data driver, the scan driver, and the light emitting driver, respectively, the data driver is connected with multiple data signal lines (D1 to Dn) respectively, the scan driver is connected with multiple scan signal lines (S1 to Sm) respectively, and the light emitting driver is connected with multiple light emitting signal lines (E1 to Eo) respectively. The pixel array may include multiple sub-pixels Pxij, wherein i and j may be natural numbers. At least one sub-pixel Pxij may include a circuit unit and a light emitting device connected with the circuit unit, wherein the circuit unit may at least include a pixel drive circuit, and the pixel drive circuit is connected with a scan signal line, a light emitting signal line, and a data signal line, respectively. In an exemplary implementation, the timing controller may provide a grayscale value and a control signal suitable for the specification of the data signal driver to the data signal driver, may provide a clock signal, a scan start signal, etc. suitable for the specification of the scan driver to the scan driver, and may provide a clock signal, an emission stop signal, etc. suitable for the specification of the light emitting driver to the light emitting driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a row of pixels as a unit, wherein n may be a natural number. The scan driver may generate a scan signals to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register and generate a scan signal in a manner of sequentially transmitting a scan start signal provided in a form of an on-level pulse to a next-stage circuit under control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may sequentially provide an emission signal with an off-level pulse to the light emitting signal lines E1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number.

Figure 2:
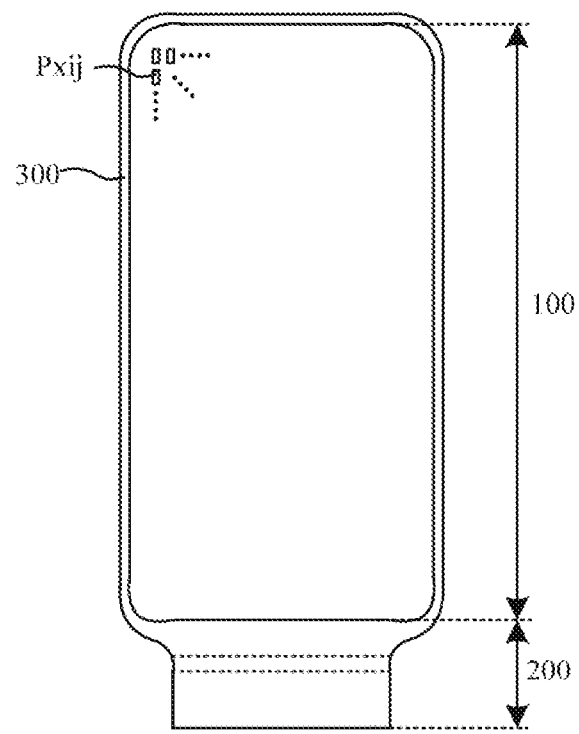
FIG. 2 is a schematic diagram of a structure of a display substrate.

FIG. 2 is a schematic diagram of a structure of a display substrate. As shown in FIG. 2, the display substrate may include a display area 100, a bonding area 200 located on one side of the display area 100, and a bezel area 300 located on another side of the display area 100. In an exemplary implementation, the display area 100 may be a flat area, including multiple sub-pixels Pxij that constitute a pixel array, wherein the multiple sub-pixels Pxij are configured to display a dynamic picture or a static image, and the display area 100 may be referred to as an Active Area (AA). In an exemplary implementation, the display substrate may be a flexible substrate, so that the display substrate may be deformable, for example, curled, bent, folded, or rolled.

In an exemplary implementation, the bonding area 200 may include a fan-out region, a bending region, a drive chip region, and a bonding pin region sequentially disposed along a direction away from the display area, wherein the fan-out region is connected with the display area 100 and at least includes data fan-out lines, and multiple data fan-out lines are configured to connect a data signal line of the display area in a fan-out trace manner. The bending region is connected with the fan-out region and may include a composite insulating layer provided with a groove, and is configured to bend the bonding area to a back of the display area. The drive chip region may include an Integrated Circuit (IC for short), and the Integrated Circuit is configured to be connected with multiple data fan-out lines. The bonding pin region may include a Bonding Pad, and the Bonding Pad is configured to be bonded and connected with an external Flexible Printed Circuit (FPC for short).

In an exemplary implementation, the bezel area 300 may include a circuit region, a power supply line region, and a crack dam region and a cutting region which are sequentially disposed along the direction away from the display area 100. The circuit region is connected with the display area 100 and may at least include multiple cascaded gate drive circuits, and the gate drive circuits are connected with multiple scan lines of the pixel drive circuits in the display area 100. The power supply line region is connected with the circuit region, and may at least include a bezel power supply lead line that extends along a direction parallel to an edge of the display area and is connected with a cathode in the display area 100. The crack dam region is connected with the power supply line region and may at least include multiple cracks arranged on the composite insulating layer. The cutting region is connected with the crack dam region and may at least include a cutting groove disposed on the composite insulating layer, wherein the cutting groove is configured for respectively cutting along the cutting groove by a cutting device after all film layers of the display substrate are manufactured.

In an exemplary implementation, the fan-out region in the bonding area 200 and the power supply line region in the bezel area 300 may be provided with a first isolation dam and a second isolation dam, the first isolation dam and the second isolation dam may extend in a direction parallel to an edge of the display area, thus forming an annular structure surrounding the display area 100, wherein an edge of the display area is an edge at a side of the display area, the bonding area or the bezel area.

Figure 3:
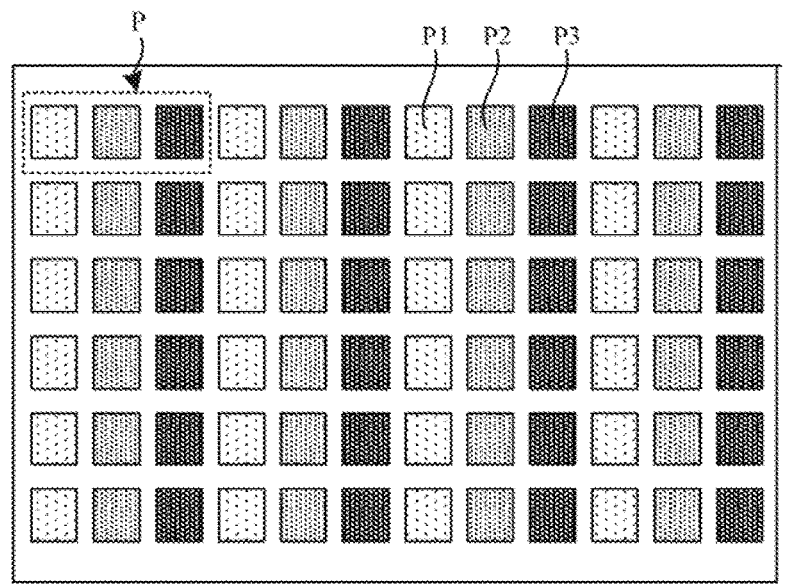
FIG. 3 is a schematic diagram of a planar structure of a display area in a display substrate.

FIG. 3 is a schematic diagram of a planar structure of a display area in a display substrate. As shown in FIG. 3, the display area may include multiple pixel units P arranged in a matrix. At least one pixel unit P may include a first sub-pixel P1 emitting light of a first color, a second sub-pixel P2 emitting light of a second color, and a third sub-pixel P3 emitting light of a third color. Each sub-pixel may include a circuit unit and a light emitting unit, wherein the circuit unit may at least include a pixel drive circuit which is connected with a scan signal line, a data signal line, and a light emitting signal line respectively, and the pixel drive circuit is configured to receive a data voltage transmitted by the data signal line and output a corresponding current to the light emitting device under control of the scan signal line and the light emitting signal line. Each sub-pixel may include a light emitting unit, and the light emitting unit may at least include a light emitting device, the light emitting device is connected with a pixel drive circuit of a sub-pixel where the light emitting device is located, and the light emitting device is configured to emit light with a corresponding brightness in response to a current output by the pixel drive circuit of the sub-pixel where the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation, a sub-pixel may be in a shape of a rectangle, a rhombus, a pentagon, or a hexagon. Three sub-pixels may be arranged side by side horizontally, side by side vertically, or in a manner like a Chinese character "品", etc., which is not limited here in the present disclosure.

In an exemplary implementation, the pixel unit may include four sub-pixels, and the four sub-pixels may be arranged horizontally, vertically or squarely, which is not limited here in the present disclosure.

Figure 4:
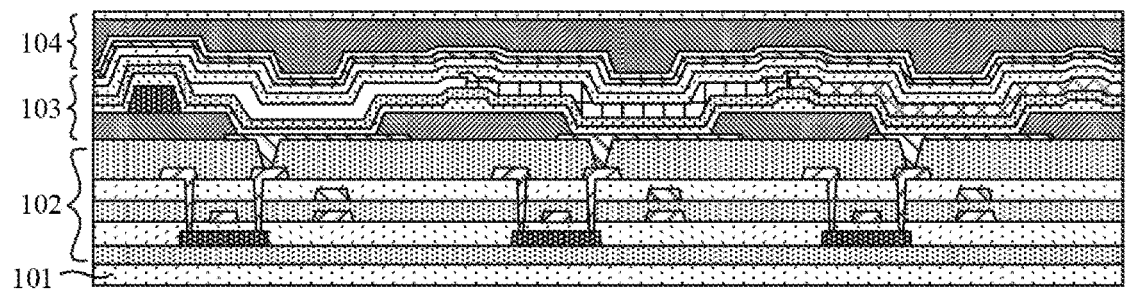
FIG. 4 is a schematic diagram of a sectional structure of a display area in a display substrate.

FIG. 4 is a schematic diagram of a sectional structure of a display area in a display substrate, illustrating a structure of three sub-pixels in the display area. As shown in FIG. 4, on a plane perpendicular to the display substrate, the display area may include a drive circuit layer 102 arranged on a base substrate 101, a light emitting structure layer 103 arranged on a side of the drive circuit layer 102 away from the base substrate 101, and an encapsulation structure layer 104 arranged on a side of the light emitting structure layer 103 away from the base substrate 101. In some possible implementations, the display substrate may include other film layers, such as a touch structure layer, etc., which is not limited here in the present disclosure.

In an exemplary implementation, the base substrate 101 may be a flexible base substrate, or may be a rigid base substrate. The drive circuit layer 102 may include multiple circuit units, a circuit unit may at least include a pixel drive circuit, and the pixel drive circuit may include multiple transistors and a storage capacitor. The light emitting structure layer 103 may include multiple light emitting units, a light emitting unit may at least include a light emitting device, the light emitting device may include an anode, an organic emitting layer, and a cathode. The anode is connected with a pixel drive circuit. The organic emitting layer is connected with the anode. The cathode is connected with the organic emitting layer. The organic emitting layer emits light of a corresponding color under driving of the anode and the cathode. The encapsulation layer 104 may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer to form a laminated structure of an inorganic material/an organic material/an inorganic material and ensure that external water vapor cannot enter the light emitting structure layer 103.

In an exemplary implementation, the organic emitting layer may include an Emitting Layer (EML), and any one or more of following layers: a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation, one or more layers of hole injection layers, hole transport layers, electron block layers, hole block layers, electron transport layers, and electron injection layers of all sub-pixels may be respectively connected together to be a common layer. Emitting layers of adjacent sub-pixels may be overlapped slightly, or may be mutually isolated.

With a rapid and widely application of display, consumers have higher and higher requirements for a display effect, especially a high refresh rate or even an ultra-high refresh rate is gradually required by all walks of life. For a high refresh rate (a high frame rate), the big difficulty is insufficient in charging time. For example, when a refresh rate is increased to 144 Hz/165 Hz, because the writing time of a single line data within one frame is shortened, difficulty in writing data and insufficient compensation will occur, resulting in defects, such as a too high black state voltage and worse threshold sensitivity.

An exemplary embodiment of the present disclosure provides a display substrate. On a plane perpendicular to the display substrate, the display substrate may include a drive circuit layer disposed on the base substrate, a light emitting structure layer disposed on one side of the drive circuit layer away from the base substrate, and an encapsulation structure layer disposed on one side of the light emitting structure layer away from the base substrate. On a plane parallel to the display substrate, a drive circuit layer of the display area may include multiple circuit units constituting multiple unit rows and multiple unit columns, a light emitting structure layer of the display area may include multiple light emitting units constituting multiple pixel rows and multiple pixel columns, at least one circuit unit may include a pixel drive circuit, at least one light emitting unit may include a light emitting device, the light emitting device is connected with a corresponding pixel drive circuit, and the light emitting device is configured to emit light of a corresponding brightness in response to a current output by the connected pixel drive circuit.

In an exemplary implementation, a light emitting unit in the present disclosure refers to a region divided according to a light emitting device, and a circuit unit in the present disclosure refers to a region divided according to a pixel drive circuit. In an exemplary implementation, a position of an orthographic projection of a light emitting unit on the base substrate may correspond to a position of an orthographic projection of a circuit unit on the base substrate, or the position of the orthographic projection of the light emitting unit on the base substrate may not correspond to the position of the orthographic projection of the circuit unit on the base substrate.

An exemplary embodiment of the present disclosure provides a display substrate including multiple circuit units constituting multiple unit rows and multiple unit columns, at least one circuit unit includes a pixel drive circuit, the pixel drive circuit at least includes a compensation transistor, a drive transistor, a data writing transistor, a first node, a second node, a first storage capacitor and a second storage capacitor. The pixel drive circuit is connected with a first scan signal line, a second scan signal line, a first power supply line and a data signal line, respectively. A gate electrode of the drive transistor is connected with the second node, a first electrode of the drive transistor is connected with the first node, and a second electrode of the drive transistor is connected with a second electrode of the compensation transistor. A gate electrode of the data writing transistor is connected with the first scan signal line, a first electrode of the data writing transistor is connected with the data signal line, and a second electrode of the data writing transistor is connected with the first node. A gate electrode of the compensation transistor is connected with the second scan signal line, and a first electrode of the compensation transistor is connected with the second node. A first end of the first storage capacitor is connected with the second node, and a second end of the first storage capacitor is connected with the first power supply line. A first end of the second storage capacitor is connected with the first node and a second end of the second storage capacitor is connected with the first power supply line.

In an exemplary implementation, on a plane perpendicular to the display substrate, the display substrate includes a semiconductor layer, a first conductive layer, a second conductive layer, and a third conductive layer that are sequentially disposed on the base substrate; the first end of the first storage capacitor includes a first electrode plate, the second end of the first storage capacitor includes a second electrode plate, the first electrode plate is disposed in the first conductive layer, and the second electrode plate is disposed in the second conductive layer.

In an exemplary implementation, the first end of the second storage capacitor includes a third electrode plate, the second end of the second storage capacitor includes a fourth electrode plate, the third electrode plate is disposed in the semiconductor layer, and the fourth electrode plate is disposed in the second conductive layer.

In another exemplary implementation, the first end of the second storage capacitor includes a fifth electrode plate, and the second end of the second storage capacitor includes a fourth electrode plate, the fourth electrode plate is disposed in the second conductive layer, and the fifth electrode plate is disposed in the third conductive layer.

In yet another exemplary implementation, the first end of the second storage capacitor includes a third electrode plate and a fifth electrode plate, the second end of the second storage capacitor includes a fourth plate, the third electrode plate is disposed in the semiconductor layer, the fourth electrode plate is disposed in the second conductive layer, the fifth electrode plate is disposed in the third conductive layer, and the third electrode plate is connected with the fifth electrode plate.

In yet another exemplary implementation, the first end of the second storage capacitor includes a third electrode plate, and the second end of the second storage capacitor includes a fourth electrode plate, the third electrode plate is disposed in the first conductive layer, and the fourth electrode plate is disposed in the second conductive layer.

In an exemplary implementation, the pixel drive circuit is further connected with a first initial signal line and a second initial signal line respectively, shapes of the first initial signal line and the second initial signal line are line shapes extending along a first direction; the first initial signal line is connected with a first connection line extending along a second direction to form a mesh structure for transmitting a first initial signal, the second initial signal line is connected with a second connection line extending along the second direction to form a mesh structure for transmitting a second initial signal, and the first direction intersects with the second direction.

The display substrate of the present disclosure is illustrated with examples below through some exemplary embodiments.

Figure 5:
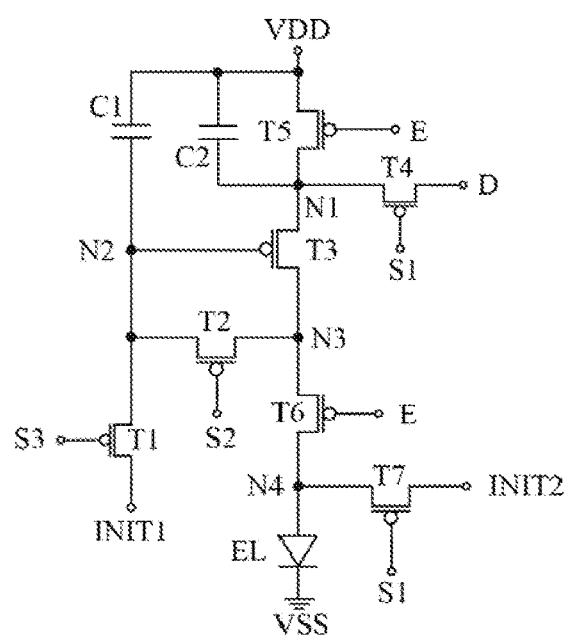
FIG. 5 is an equivalent circuit diagram of a pixel drive circuit according to an exemplary embodiment of the present disclosure.

FIG. 5 is an equivalent circuit diagram of a pixel drive circuit according to an exemplary embodiment of the present disclosure. In an exemplary implementation, the pixel drive circuit may have a structure of 3T1C, 4T1C, 5T1C, 5T2C, 6T1C, 7T1C, or 8T1C. As shown in FIG. 5, the pixel drive circuit of an exemplary embodiment of the present disclosure may include seven transistors (a first transistor T1 to a seventh transistor T7) and two storage capacitors C (a first storage capacitor C1 and a second storage capacitor C2), and the pixel drive circuit is respectively connected with eight signal lines (a first scan signal line S1, a second scan signal line S2, a third scan signal line S3, a light emitting signal line E, a first initial signal line INIT1, a second initial signal line INIT2, a data signal line D and a first power supply line VDD).

In an exemplary implementation, the pixel drive circuit may include a first node N1, a second node N2, a third node N3 and a fourth node N4. Herein, the first node N1 is respectively connected with a first electrode of the third transistor T3 and a second electrode of the fourth transistor T4, a second electrode of the fifth transistor T5, and a second end of the second storage capacitor C2, the second node N2 is respectively connected with a second electrode of the first transistor, a first electrode of the second transistor T2, a gate electrode of the third transistor T3, and a second end of the first storage capacitor C1, the third node N3 is respectively connected with a second electrode of the second transistor T2, a second electrode of the third transistor T3, and a first electrode of the sixth transistor T6, and the fourth node N4 is respectively connected with a second electrode of the sixth transistor T6 and a second electrode of the seventh transistor T7.

In an exemplary implementation, a first end of the first storage capacitor C1 is connected with the second node N2, a second end of the first storage capacitor C1 is connected with the first power supply line VDD, a first end of the second storage capacitor C2 is connected with the first node N1, a second end of the second storage capacitor C2 is connected with the first power supply line VDD, and the signal of the first power supply line VDD is a continuously supplied high level signal.

In an exemplary implementation, a gate electrode of the first transistor T1 is connected with the third scan signal line S3, a first electrode of the first transistor T1 is connected with the first initial signal line INIT1, and a second electrode of the first transistor is connected with the second node N2. When a scan signal with an on-level is applied to the third scan signal line S3, the first transistor T1 transmits a first initial voltage to a gate electrode of the third transistor T3, so as to initialize a charge amount of the gate electrode of the third transistor T3.

In an exemplary implementation, a gate electrode of the second transistor T2 (a compensation transistor) is connected with the second scan signal line S2, the first electrode of the second transistor T2 is connected with the second node N2, and the second electrode of the second transistor T2 is connected with the third node N3. When a scan signal with an on-level is applied to the second scan signal line S2, the second transistor T2 enables a gate electrode of the third transistor T3 to be connected with a second electrode of the third transistor T3.

In an exemplary implementation, a gate electrode of the third transistor T3 is connected with the second node N2, i.e., the gate electrode of the third transistor T3 is connected with a second end of the first storage capacitor C1, a first electrode of the third transistor T3 is connected with the first node N1, and a second electrode of the third transistor T3 is connected with the third node N3. The third transistor T3 may be referred to as a drive transistor and the third transistor T3 determines a magnitude of the drive current according to a potential difference between the gate electrode and the first electrode of the third transistor T3.

In an exemplary implementation, a gate electrode of the fourth transistor T4 (a data writing transistor) is connected with the first scan signal line S1, a first electrode of the fourth transistor T4 is connected with the data signal line D, and a second electrode of the fourth transistor T4 is connected with the first node N1. When a scan signal with an on-level is applied to the first scan signal line S1, the fourth transistor T4 enables a data voltage of the data signal line D to be input to the pixel drive circuit.

In an exemplary implementation, a gate electrode of the fifth transistor T5 is connected with the light emitting signal line E, a first electrode of the fifth transistor T5 is connected with the first power supply line VDD, and a second electrode of the fifth transistor T5 is connected with the first node N1. A gate electrode of the sixth transistor T6 is connected with the light emitting signal line E, a first electrode of the sixth transistor T6 is connected with the third node N3, and a second electrode of the sixth transistor T6 is connected with the fourth node N4. When a light emitting signal with an on-level is applied to the light emitting signal line E, the fifth transistor T5 and the sixth transistor T6 enable the light emitting device EL to emit light by forming a drive current path between the first power supply line VDD and the second power supply line VSS.

In an exemplary implementation, a gate electrode of the seventh transistor T7 is connected with the first scan signal line S1, a first electrode of the seventh transistor T7 is connected with the second initial signal line INIT2, and a second electrode of the seventh transistor T7 is connected with the fourth node N4. When a scan signal with an on-level is applied to the first scan signal line S1, the seventh transistor T7 transmits a second initial voltage to a first electrode of the light emitting device EL so as to initialize a charge amount accumulated in the first electrode of the light emitting device EL or release a charge amount accumulated in the first electrode of the light emitting device EL.

In an exemplary implementation, the light emitting device EL may be an OLED including a first electrode (anode), an organic emitting layer, and a second electrode (cathode), which are stacked, or may be a QLED including a first electrode (anode), a quantum dot light emitting layer, and a second electrode (cathode), which are stacked. A first electrode of the light emitting device EL is connected with the second node N4, a second electrode of the light emitting device EL is connected with a second power supply line VSS, and a signal of the second power supply line VSS is a continuously supplied low level signal.

In an exemplary implementation, the first transistor T1 to the seventh transistor T7 may be P-type transistors, or may be N-type transistors. Use of a same type of transistors in a pixel drive circuit may simplify a process flow, reduce a process difficulty of a display panel, and improve a product yield. In some possible implementations, the first transistor T1 to the seventh transistor T7 may include a P-type transistor and an N-type transistor.

In an exemplary implementation, for the first transistor T1 to the seventh transistor T7, low temperature poly-crystalline silicon thin film transistors may be adopted, or oxide thin film transistors may be adopted, or both a low temperature poly-crystalline silicon thin film transistor and an oxide thin film transistor may be adopted. An active layer of a low temperature poly-crystalline silicon thin film transistor may be made of Low Temperature Poly-crystalline Silicon (LTPS for short), and an active layer of an oxide thin film transistor may be made of an oxide semiconductor (Oxide). The low temperature poly-crystalline silicon thin film transistor has advantages, such as, a high mobility, fast charging, and the oxide thin film transistor has advantages, such a low drain current. The low temperature poly-crystalline silicon thin film transistor and the oxide thin film transistor are integrated on one display substrate to form a LTPS+Oxide (LTPO for short) display substrate, so that advantages of the low temperature poly-crystalline silicon thin film transistor and the oxide thin film transistor can be utilized, low-frequency driving can be achieved, power consumption can be reduced, and display quality can be improved.

Figure 6:
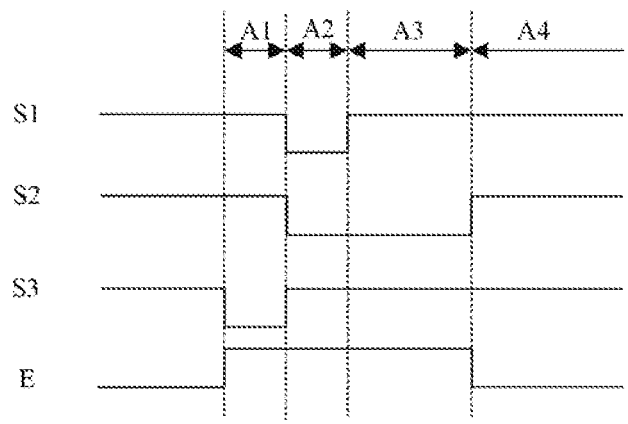
FIG. 6 illustrates a drive timing diagram of a pixel drive circuit according to an exemplary embodiment of the present disclosure.

FIG. 6 illustrates a drive timing diagram of a pixel drive circuit according to an exemplary embodiment of the present disclosure. Taking a case in which the first transistor T1 to the seventh transistor T7 in a pixel drive circuit as shown in FIG. 5 are all P-type transistors as an example, as shown in FIG. 6, a working process of the pixel drive circuit may include the following time stages.

At a first time stage A1, referred to as a reset time stage, a signal of the third scan signal line S3 is a low level signal and signals of the first scan signal line S1, the second scan signal line S2 and the light emitting signal line E are high level signals; the low level signal of the third scan signal line S3 turns the first transistor T1 on, a first initial voltage of the first initial signal line INIT1 is provided to the second node N2 to initialize the first storage capacitor C1, thereby clearing an original data voltage in the first storage capacitor. Since the second end of the first storage capacitor C1 is at a low level, the third transistor T3 is turned on. The signals of the first scan signal line S1, the second scan signal line S2 and the light emitting signal line E are high level signals, so that the second transistor T2, the fourth transistor T4, the fifth transistor T5, the sixth transistor T6, and the seventh transistor T7 are turned off.

At a second time stage A2, referred to as a data writing time stage, signals of the first scan signal line S1 and the second scan signal line S2 are low level signals, signals of the third scan signal line S3 and the light emitting signal line E are high level signals, and the data signal line D outputs a data voltage, the low level signal of the first scan signal line S1 turns the fourth transistor T4 and the seventh transistor T7 on, and the low level signal of the second scan signal line S2 turns the second transistor T2 on; the second transistor T2 and the fourth transistor T4 are turned on, so that the data voltage output by the data signal line D is charged to the second end of the second storage capacitor C2 via the first node N1 on one hand, and provided to the second end of the first storage capacitor C1 via the first node N1, the turned-on third transistor T3, the third node N3, the turned-on second transistor T2, the second node N2 on the other hand; the seventh transistor T7 is turned on, so that a second initial voltage of the second initial signal line INIT2 is provided to the fourth node N4 (a first electrode of an OLED) to initialize (reset) the first electrode of the OLED and clear its internal pre-stored voltage, thereby completing initialization. Signals of the third scan signal line S3 and the light emitting signal line E are high level signals, so that the first transistor T1, the fifth transistor T5, and the sixth transistor T6 are turned off. In an exemplary implementation, a time length of the data writing time stage may be referred to as a single line data writing time length (1$h$) and a refresh rate of the display substrate refers to a frequency in which the first scan signal line S1 provides a turned-on signal.

At a third time stage A3, referred to as a threshold compensation time stage, a signal of the second scan signal line S2 continues to be a low level signal, and signals of the first scan signal line S1, the third scan signal line S3 and the light emitting signal line E are high level signals, the low level signal of the second scan signal line S2 enables the second transistor T2 to continue to be on; a voltage charged by the second storage capacitor C2 in the second time stage is provided to the second end of the first storage capacitor C1 via the first node N1, the turned-on third transistor T3, the third node N3, the turned-on second transistor T2 and the second node N2, so that a data voltage is continuously written into the first storage capacitor C1 and compensated for the third transistor T3, and a difference between the data voltage and a threshold voltage of the third transistor T3 is charged into the first storage capacitor C1. A voltage at the second end of the first storage capacitor C1 (the second node N2) is Vd−|Vth|, where Vd is the data voltage output by the data signal line D and Vth is the threshold voltage of the third transistor T3. In an exemplary implementation, a time length of the threshold compensation time stage may be greater than or equal to a time length of the data writing time stage.

At a fourth time stage A4, referred to as a light emitting time stage, a signal of the light emitting signal line E is a low level signal and signals of the first scan signal line S1, the second scan signal line S2 and the third scan signal line S3 are high level signals, the signal of the light emitting signal line E is a low level signal, so that the fifth transistor T5 and the sixth transistor T6 are turned on, and a power supply voltage output by the first power supply line VDD provides a drive voltage to the first electrode of the OLED through the turned-on fifth transistor T5, third transistor T3, and sixth transistor T6 to drive the OLED to emit light.

In a driving process of the pixel drive circuit, a drive current flowing through the third transistor T3 (a drive transistor) is determined by a voltage difference between a gate electrode and a first electrode of the third transistor T3. A voltage of the second node N2 is Vdata-|Vth|, so the drive current of the third transistor T3 is as follows.

$$I = K*(Vgs - Vth)^2 = K*[(Vdd - Vd + |Vth|) - Vth]^2 = K*[(Vdd - Vd)]^2$$

Where, I is the drive current flowing through the third transistor T3, i.e., a drive current for driving the OLED, K is a constant, Vgs is a voltage difference between the gate electrode and the first electrode of the third transistor T3, Vth is a threshold voltage of the third transistor T3, Vd is a data voltage output by the data signal line D, and Vdd is a power supply voltage output by the first power supply line VDD.

In an exemplary implementation, a time length of the threshold compensation time stage may be about n times the time length of the data writing time stage and n may be a positive integer greater than or equal to 1 and less than or equal to 9.

Table 1 shows test results of a time length of the threshold compensation time stage and a data voltage range (Data Range), which shows data voltage ranges of R/G/B pixel corresponding to the time lengths of different threshold compensation time stages. The data voltages in brackets are a data voltage corresponding to a grayscale 255 and a data voltage corresponding to a grayscale 0, respectively. As shown in Table 1, under a 165 Hz high frequency display, with an increase of the time length of the threshold compensation time stage, not only a black state voltage decreases, which can ensure a data writing in a high frequency state, but also the data voltage range increases, which can ensure the clearer definition of different grayscale pictures and improve an image quality of a screen at a high frequency.

TABLE 1

Test results of a time length of a threshold compensation time stage and a data voltage range

| Data voltage range | | n = 1 (1 time) | n = 3 (3 times) | n = 5 (5 times) |
|---|---|---|---|---|
| 165 Hz | R | 2.63 (4.26~6.89) | 2.74 (3.52~6.26) | 2.72 (3.45~6.17) |
| (1 h = | G | 2.19 (4.73~6.92) | 2.30 (4.02~6.32) | 2.30 (3.95~6.25) |
| 2.5 μs) | B | 3.08 (3.60~6.68) | 3.18 (2.84~6.02) | 3.19 (2.76~5.95) |

In a pixel drive circuit scheme adopting a 7T1C, since the second transistor T2 and the fourth transistor T4 are controlled by a same scan signal line, the data writing and threshold compensation time has only a single line data writing time length, and when the refresh rate is high, the sub-pixel cannot display a lower grayscale picture. In the pixel drive circuit provided by an exemplary embodiment of the present disclosure, the fourth transistor T4 is controlled by the first scan signal line S1, the second transistor T2 is controlled by the second scan signal line S2, a time length for outputting the turned-on signal by the second scan signal line S2 is longer than a time length for outputting the turned-on signal by the first scan signal line S1, and the second storage capacitor C2 is disposed between the first electrode and the second electrode of the fifth transistor T5, so that the data writing time stage and the threshold compensation time stage are separated, and not only the data writing time can be prolonged, but also the compensation time can be guaranteed to be sufficient. In a process of driving the pixel drive circuit, the first scan signal line S1 corresponding to the fourth transistor T4 controls normal data writing in a single-line data writing time length, and the second scan signal line S2 corresponding to the second transistor T2 controls data writing and threshold compensation in multiple single-line data writing time lengths, thus prolonging the data writing time. The newly added second storage capacitor C2 can not only make the data voltage first stored in the second storage capacitor C2 during the data writing time stage, so that the data writing time stage is insensitive to the Source loading, but also ensure that the data writing can be continued during the time when the fourth transistor T4 is turned off and the second transistor T2 is turned on, thus realizing low-grayscale image quality. Compared with an existing 7T1C pixel drive circuit scheme, the present disclosure effectively improves the problems such as insufficient charging time and insufficient compensation time in the existing scheme by adjusting the writing and compensation modes, clearer definition of different grayscale pictures can be ensured, the image quality of high frequency display can be ensured, and a display effect and a display quality are improved.

Figure 7A:
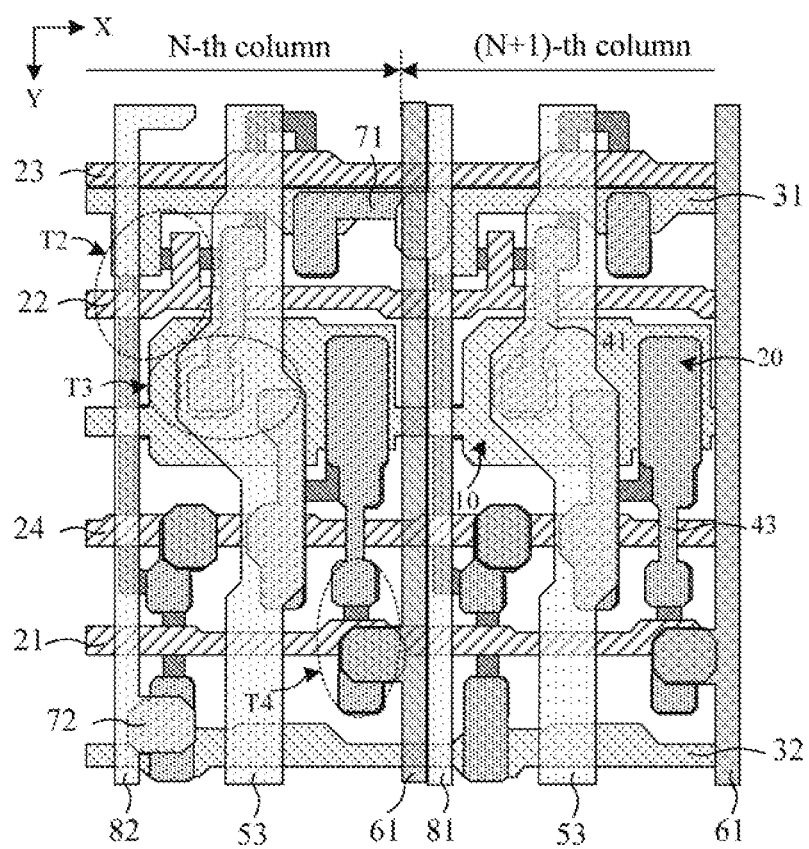
FIG. 7A is a schematic diagram of a planar structure of a display substrate according to an exemplary embodiment of the present disclosure.

FIG. 7A is a schematic diagram of a planar structure of a display substrate according to an exemplary embodiment of the present disclosure, illustrating a structure of pixel drive circuits in two circuit units in a display area. As shown in FIG. 7A, a pixel drive circuit of at least one circuit unit may at least include a second transistor T2 as a compensation transistor, a third transistor T3 as a drive transistor, a fourth transistor T4 as a data writing transistor, a third connection electrode 43 as a first node, a first connection electrode 41 as a second node, a first storage capacitor 10 and a second storage capacitor 20. The pixel drive circuit is respectively connected with a first scan signal line 21, a second scan signal line 22, a third scan signal line 23, a light emitting control line 24, a first initial signal line 31, a second initial signal line 32, a first power supply line 53 and a data signal line 61.

In an exemplary implementation, shapes of the first scan signal line 21, the second scan signal line 22, the third scan signal line 23, the light emitting control line 24, the first initial signal line 31, and the second initial signal line 32 may be line shapes extending along a first direction X, and shapes of the first power supply line 53 and the data signal line 61 may be line shapes extending along a second direction Y, and the first direction X intersects with the second direction Y. The first scan signal line 21 and the second scan signal line 22 are configured to provide the first scan signal and the second scan signal to the pixel drive circuit, the data signal line 51 is configured to provide the data signal to the pixel drive circuit, the first power supply line 52 is configured to provide the first power supply signal to the pixel drive circuit, and the first initial signal line 31 and the second initial signal line 32 are configured to provide the first initial signal and the second initial signal to the pixel drive circuit, respectively, the first initial signal may be configured to initialize (reset) the first storage capacitor, and the second initial signal may be configured to initialize (reset) the light emitting device.

In the present disclosure, A extends along a B direction means that A may include a main portion and a secondary portion connected with the main portion, the main portion is a line, a line segment, or a strip-shaped body, the main portion extends along the B direction, and a length of the main portion extends along the B direction is greater than a length of the secondary portion extends along another direction.

In an exemplary implementation, a gate electrode of the second transistor T2 is connected with the second scan signal line 22, the first electrode of the second transistor T2 is connected with the first connection electrode 41 (second node), and the second electrode of the second transistor T2 is connected with the second electrode of the third transistor T3. A gate electrode of the third transistor T3 is connected with the first connection electrode 41 (second node) and a first electrode of the third transistor T3 is connected with the third connection electrode 43 (first node). A gate electrode of the fourth transistor T4 is connected with the first scan signal line 21, a first electrode of the fourth transistor T4 is connected with the data signal line 61, and a second electrode of the fourth transistor T4 is connected with the third connection electrode 43 (first node). A first end of the first storage capacitor 10 is connected with the first connection electrode 41 (second node), and a second end of the first storage capacitor 10 is connected with the first power supply line 53. A first end of the second storage capacitor 20 is connected with the third connection electrode 43 (first node) and a second end of the second storage capacitor 20 is connected with the first power supply line 53.

In an exemplary implementation, the first end of the first storage capacitor 10 may include a first electrode plate, and the second end of the first storage capacitor 10 may include a second electrode plate, the first electrode plate may be disposed in the first conductive layer, the second electrode plate may be disposed in the second conductive layer, and an orthographic projection of the second electrode plate on the base substrate is at least partially overlapped with an orthographic projection of the first electrode plate on the base substrate.

In an exemplary implementation, the first end of the second storage capacitor 20 may include a third electrode plate and a fifth electrode plate, the second end of the second storage capacitor 20 may include a fourth electrode plate, the third electrode plate may be disposed in the semiconductor layer, the fourth electrode plate may be disposed in the second conductive layer, the fifth electrode plate may be disposed in the third conductive layer, an orthographic projection of the fourth electrode plate on the base substrate is at least partially overlapped with an orthographic projection of the third electrode plate on the base substrate, an orthographic projection of the fifth electrode plate on the base substrate is at least partially overlapped with the orthographic projection of the fourth electrode plate on the base substrate, and the third electrode plate is connected with the fifth electrode plate.

In an exemplary implementation, a capacitance value of the second storage capacitor 20 may be less than a capacitance value of the first storage capacitor 10.

In an exemplary implementation, the capacitance value of the second storage capacitor 20 may be about 20% to 70% of the capacitance value of the first storage capacitor 10. For example, the capacitance value of the second storage capacitor 20 may be about 30% to 50% of the capacitance value of the first storage capacitor 10.

In an exemplary implementation, the semiconductor layer may at least include an active layer of the third transistor T3, and the third electrode plate and the active layer of the third transistor T3 may be of an interconnected integral structure.

In an exemplary implementation, the second electrode plate and the fourth electrode plate may be of an interconnected integral structure.

In an exemplary implementation, the third connection electrode 43 (first node) may be disposed in the third conductive layer, the third connection electrode 43 and the fifth electrode plate are of an interconnected integral structure, and the third connection electrode 43 is connected with the third electrode plate through a via.

Figure 7B:
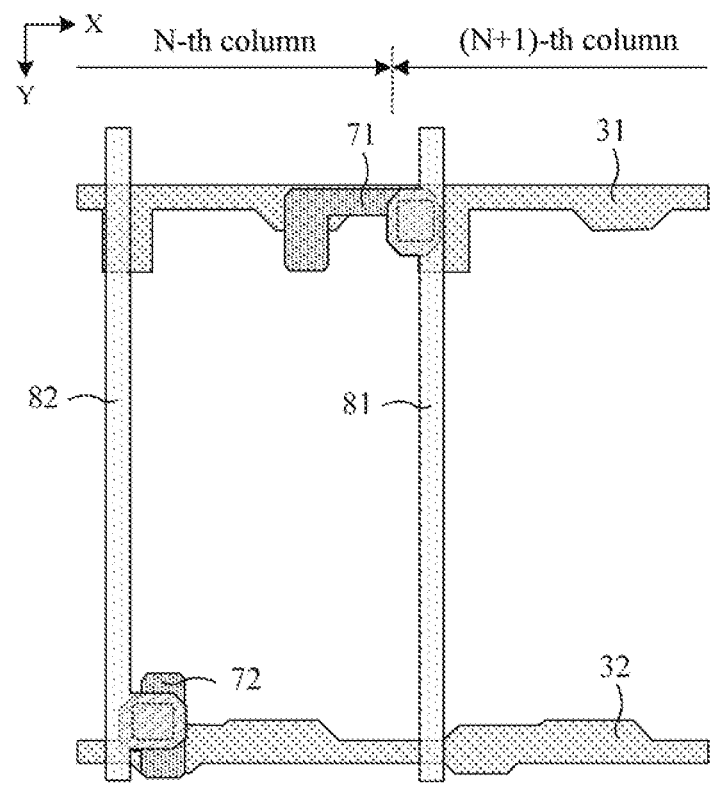
FIG. 7B is a schematic diagram of a structure of an initial signal line with a mesh structure according to an exemplary embodiment of the present disclosure.

FIG. 7B is a schematic diagram of a structure of an initial signal line with a mesh structure according to an exemplary embodiment of the present disclosure. As shown in FIG. 7B, a first initial signal line 31 is connected with a first connection line 81 extending along the second direction Y, and a second initial signal line 32 is connected with a second connection line 82 extending along the second direction Y, and a mesh structure for transmitting a first initial signal and a mesh structure for transmitting a second initial signal are simultaneously formed on a display substrate.

In an exemplary implementation, a first initial signal line 31 and a second initial signal line 32 are disposed in a circuit unit of at least one unit row, a first connection line 81 is provided in a circuit unit of an odd-numbered unit column ((N+1)-th column), a second connection line 82 is provided in a circuit unit of an even-numbered unit column (N-th column), multiple first connection lines 81 of the odd-numbered unit columns are connected with first initial signal lines 31 of multiple unit rows, and multiple second connection lines 82 of the even-numbered unit columns are connected with second initial signal lines 32 of multiple unit rows.

In another exemplary implementation, a first initial signal line 31 and a second initial signal line 32 are disposed in a circuit unit of at least one unit row, a first connection line 81 is provided in a circuit unit of an even-numbered unit column (N-th column), a second connection line 82 is provided in a circuit unit of an odd-numbered unit column ((N+1)-th column), multiple first connection lines 81 of the even-numbered unit columns are connected with first initial signal lines 31 of multiple unit rows, and multiple second connection lines 82 of the odd-numbered unit columns are connected with second initial signal lines 32 of multiple unit rows.

In an exemplary implementation, on a plane perpendicular to the display substrate, the display substrate may include a semiconductor layer, a first conductive layer, a second conductive layer, a third conductive layer, and a fourth conductive layer that are sequentially disposed on the base substrate, active layers of the second transistor T2, the third transistor T3, and the fourth transistor T4 may be disposed in the semiconductor layer, the first scan signal line 21, the second scan signal line 22, the third scan signal line 23, and the light emitting control line 24 may be disposed in the first conductive layer, the first initial signal line 31 and the second initial signal line 32 may be disposed in the second conductive layer, the first connection electrode 41 and the third connection electrode 43 may be disposed in the third conductive layer, and the first power supply line 53, the first connection line 81, and the second connection line 84 may be disposed in the fourth conductive layer.

In an exemplary implementation, the third conductive layer in at least one circuit unit may further include the first initial electrode 71, the first connection line 81 in the fourth conductive layer is connected with the first initial electrode 71 in the third conductive layer through a via, and the first initial electrode 71 in the third conductive layer is connected with the first initial signal line 31 in the second conductive layer through a via.

In an exemplary implementation, the third conductive layer in at least one circuit unit may further include the second initial electrode 72, the second connection line 82 in the fourth conductive layer is connected with the second initial electrode 72 in the third conductive layer through a via, and the second initial electrode 72 in the third conductive layer is connected with the second initial signal line 32 in the second conductive layer through a via.

In an exemplary implementation, an orthographic projection of the data signal line 61 on the base substrate is at least partially overlapped with an orthographic projection of the first connection line 81 on the base substrate, and an orthographic projection of the data signal line 61 on the base substrate is at least partially overlapped with an orthographic projection of the second connection line 82 on the base substrate.

In an exemplary implementation, the display substrate may at least include a first insulating layer, a second insulating layer, a third insulating layer, a fourth insulating layer, a fifth insulating layer and a first planarization layer. The first insulating layer is disposed between the base substrate and the semiconductor layer, the second insulating layer is disposed between the semiconductor layer and the first conductive layer, the third insulating layer is disposed between the first conductive layer and the second conductive layer, the fourth insulating layer is disposed between the second conductive layer and the third conductive layer, the fifth insulating layer is disposed between the third conductive layer and the fourth conductive layer, and the first planarization layer is disposed between the fourth conductive layer and the fifth conductive layer.

Exemplary description is made below through a manufacturing process of a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation and chemical vapor deposition, the coating may be any one or more of spray coating, spin coating and inkjet printing, and the etching may be any one or more of dry etching and wet etching, the present disclosure is not limited thereto. A "thin film" refers to a layer of thin film made of a certain material on a substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are disposed in a same layer" in the present disclosure means that A and B are formed simultaneously through a same patterning process, and a "thickness" of a film layer is a size of the film layer in a direction perpendicular to a display substrate. In an exemplary embodiment of the present disclosure, "an orthographic projection of B being located within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

In an exemplary implementation, the process of manufacturing the display substrate according to the present embodiment may include the following acts.

Figure 8:
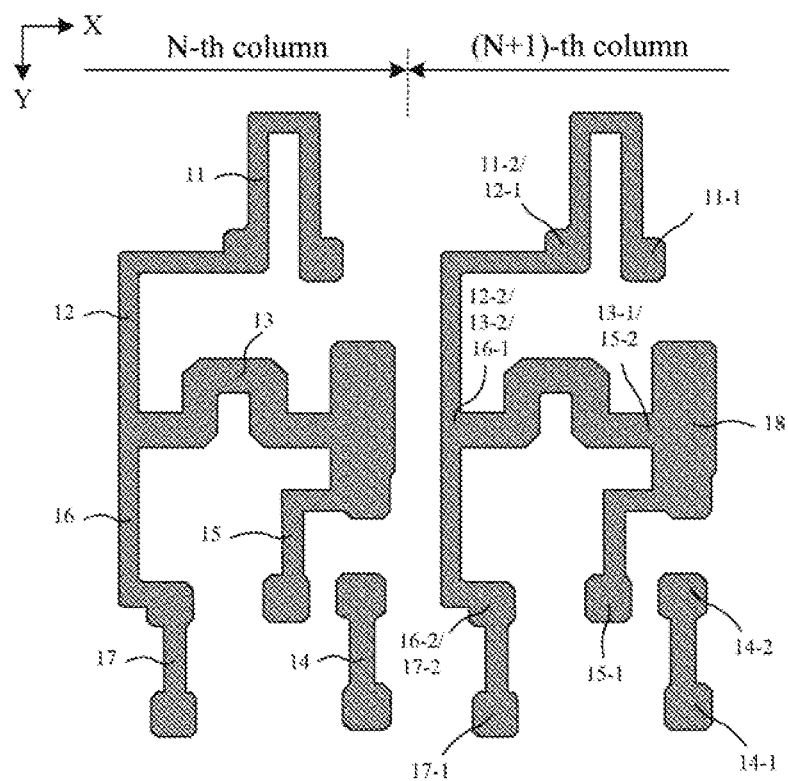
FIG. 8 is a schematic diagram of a display substrate after a pattern of a semiconductor layer is formed according to the present disclosure.

(11) A pattern of a semiconductor layer is formed. In an exemplary implementation, forming the pattern of the semiconductor layer may include: a first insulating thin film and a semiconductor thin film are sequentially deposited on a base substrate, and the semiconductor thin film is patterned through a patterning process to form a first insulating layer that covers the base substrate and the semiconductor layer disposed on the first insulating layer, as shown in FIG. 8.

In an exemplary implementation, the semiconductor layer of each circuit unit in the display area may at least include a first active layer 11 of a first transistor T1, a second active layer 12 of the a second transistor T2, a third active layer 13 of a third transistor T3, a fourth active layer 14 of a fourth transistor T4, a fifth active layer 15 of a fifth transistor T5, a sixth active layer 16 of a sixth transistor T6, a seventh active layer 17 of a seventh transistor T7, and a third electrode plate 18 of a second storage capacitor, and the first active layer 11 to the third active layer 13, the fifth active layer 15 to the seventh active layer 17 and the third electrode plate 18 may be of an interconnected integral structure, and the fourth active layer 14 may be separately disposed.

In an exemplary implementation, the fourth active layer 14 is separately disposed on a side of the third electrode plate 18 in the second direction Y in order to avoid the third electrode plate 18 provided on the semiconductor layer.

In an exemplary implementation, the first active layer 11 and the second active layer 12 may be located on a side of the third active layer 13 of the present circuit unit in an opposite direction of a second direction Y. The fourth active layer 14, the fifth active layer 15, the sixth active layer 16, and the seventh active layer 17 may be located on a side of the third active layer 13 of the present circuit unit in the second direction Y.

In an exemplary implementation, a shape of the first active layer 11 may be an "n" shape, shapes of the second active layer 12 and the fifth active layer 15 may be an "L" shape, a shape of the third active layer 13 may be an "Ω" shape, and shapes of the fourth active layer 14, the sixth active layer 16, and the seventh active layer 17 may be an "I" shape.

In an exemplary implementation, an active layer of each transistor may include a first region, a second region, and a channel region located between the first region and the second region. In an exemplary implementation, a first region 11-1 of the first active layer, a first region 14-1 of the fourth active layer, a second region 14-2 of the fourth active layer, a first region 15-1 of the fifth active layer, and a first region 17-1 of the seventh active layer may be separately disposed, a second region 11-2 of the first active layer may serve as a first region 12-1 of the second active layer, a first region 13-1 of the third active layer may serve as a second region 15-2 of the fifth active layer, a second region 13-2 of the third active layer may simultaneously serve as a second region 12-2 of the second active layer and a first region 16-1 of the sixth active layer, and a second region 16-2 of the sixth active layer may serve as a second region 17-2 of the seventh active layer.

In an exemplary implementation, the third electrode plate 18 of the second storage capacitor may have a rectangular shape, chamfers may be provided at corners of the rectangle, the third electrode plate 18 may be located on a side of the third active layer 13 of the present circuit unit in the first direction X, and the third electrode plate 18, the first region 13-1 of the third active layer and the second region 15-2 of the fifth active layer are of an interconnected integral structure. In an exemplary implementation, the third electrode plate 18 may serve as a electrode plate of the second storage capacitor.

In an exemplary implementation, the first region 13-1 of the third active layer may serve as the first electrode of the third transistor T3, the second region 15-2 of the fifth active layer may serve as the second electrode of the fifth transistor T5, the first electrode of the third transistor T3, the second electrode of the fifth transistor T5 and the third electrode plate 18 are interconnected, and a connection point thereof is the first node N1 of the pixel drive circuit. The second region 12-2 of the second active layer may serve as the second electrode of the second transistor T2, the second region 13-2 of the third active layer may serve as the second electrode of the third transistor T3, the first region 16-1 of the sixth active layer may serve as the first electrode of the sixth transistor T6, the second electrode of the second transistor T2, the second electrode of the third transistor T3 and the first electrode of the sixth transistor T6 are interconnected, and a connection point thereof is the third node N3 of the pixel drive circuit. The second region 16-2 of the sixth active layer may serve as the second electrode of the sixth transistor T6, the second region 17-2 of the seventh active layer may serve as the second electrode of the seventh transistor T7, the second electrode of the sixth transistor T6 and the second electrode of the seventh transistor T7 are interconnected, and a connection point thereof is the fourth node N4 of the pixel drive circuit.

Figure 9A:
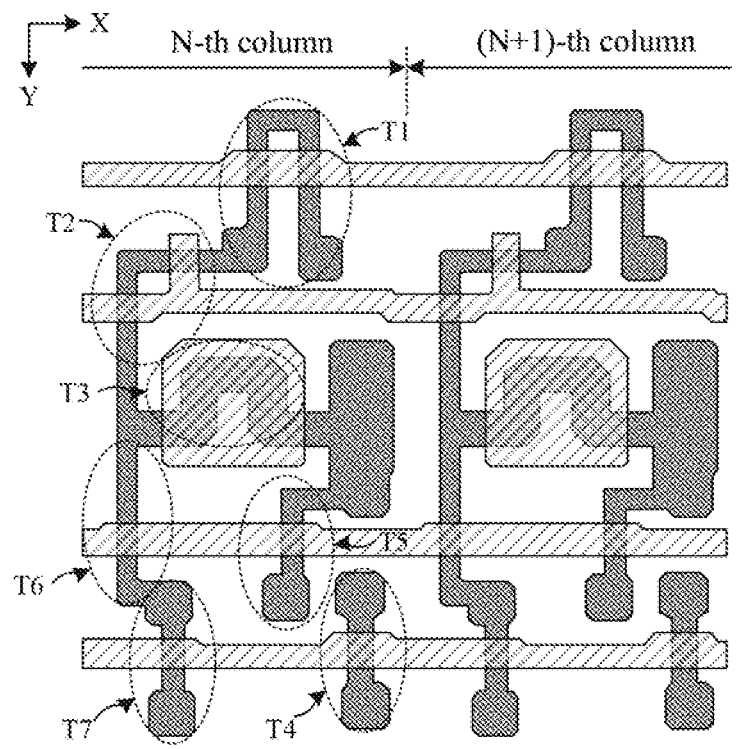
FIG. 9A and FIG. 9B are schematic diagrams of a display substrate after a pattern of a first conductive layer is formed according to the present disclosure.
Figure 9B:
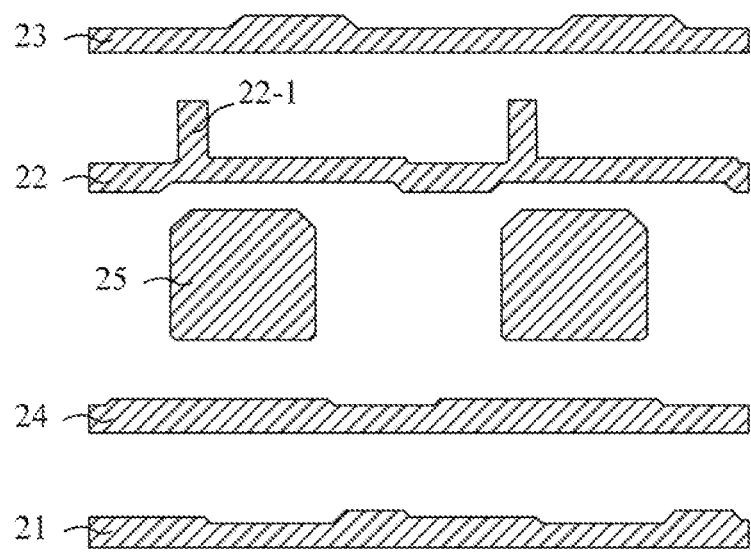

(12) A pattern of a first conductive layer is formed. In an exemplary implementation, forming the pattern of the first conductive layer may include: a second insulating thin film and a first conductive thin film are sequentially deposited on the base substrate on which the aforementioned patterns are formed, and the first conductive thin film is patterned through a patterning process to form a second insulating layer that covers the pattern of the semiconductor layer and a pattern of a first conductive layer disposed on the second insulating layer, as shown in FIG. 9A and FIG. 9B, and FIG. 9B is a schematic diagram of the first conductive layer in FIG. 9A. In an exemplary implementation, the first conductive layer may be referred to as a first gate metal (GATE1) layer.

In an exemplary implementation, the pattern of the first conductive layer of each circuit unit in the display area at least includes: a first scan signal line 21, a second scan signal line 22, a third scan signal line 23, a light emitting control line 24, and a first electrode plate 25 of a first storage capacitor.

In an exemplary implementation, a shape of the first electrode plate 25 of the first storage capacitor may be a rectangular shape, and chamfers may be provided at corners of the rectangle. An orthographic projection of the first electrode plate 25 on the base substrate is at least partially overlapped with an orthographic projection of the third active layer of the third transistor T3 on the base substrate. In an exemplary implementation, the first electrode plate 25 may serve as an electrode plate of the first storage capacitor and the gate electrode of the third transistor T3 simultaneously.

In an exemplary implementation, an area of an orthographic projection of the third electrode plate 18 on the base substrate may be smaller than an area of an orthographic projection of the first electrode plate 25 on the base substrate.

In an exemplary implementation, shapes of the first scan signal line 21, the second scan signal line 22, the third scan signal line 23, and the light emitting control line 24 may be line shapes, main body portions of the first scan signal line 21, the second scan signal line 22, the third scan signal line 23, and the light emitting control line 24 extend along a first direction X to form line shapes, respectively. The first scan signal line 21 and the light emitting control line 24 may be located on a side of the first electrode plate 25 of the present circuit unit in the second direction Y, the second scan signal line 22 and the third scan signal line 23 may be located on a side of the first electrode plate 25 of the present circuit unit in an opposite direction of the second direction Y, the first scan signal line 21 may be located on a side of the light emitting control line 24 of the present circuit unit away from the first electrode plate 25, and the third scan signal line 23 may be located on a side of the second scan signal line 22 of the present circuit unit away from the first electrode plate 25.

In an exemplary implementation, a region where the first scan signal line 21 overlaps the fourth active layer may serve as a gate electrode of the fourth transistor T4, a region where the first scan signal line 21 overlaps the seventh active layer may serves as a gate electrode of the seventh transistor T7, a region where the third scan signal line 23 overlaps the first active layer may serve as a gate electrode of the first transistor T1 with a double-gate structure, a region where the light emitting control line 24 overlaps the fifth active layer may serve as a gate electrode of the fifth transistor T5, and a region where the light emitting control line 24 overlaps the sixth active layer may serve as a gate electrode of the sixth transistor T6.

In an exemplary implementation, the second scan signal line 22 may be provided with a gate block 22-1 protruding toward a side of the third scan signal line 23, and a region where the second scan signal line 22 and the gate block 22-1 are overlapped with the second active layer may serve as a gate electrode of the second transistor T2 to form the second transistor T2 with a double-gate structure.

In an exemplary implementation, the first scan signal line 21, the second scan signal line 22, the third scan signal line 23, and the light emitting control line 24 may extend along the first direction X to a bezel area on a side or two sides of the display area, to be connected with a corresponding gate drive circuit, and output a corresponding turned-on control signal in accordance with a set drive timing.

Figure 10A:
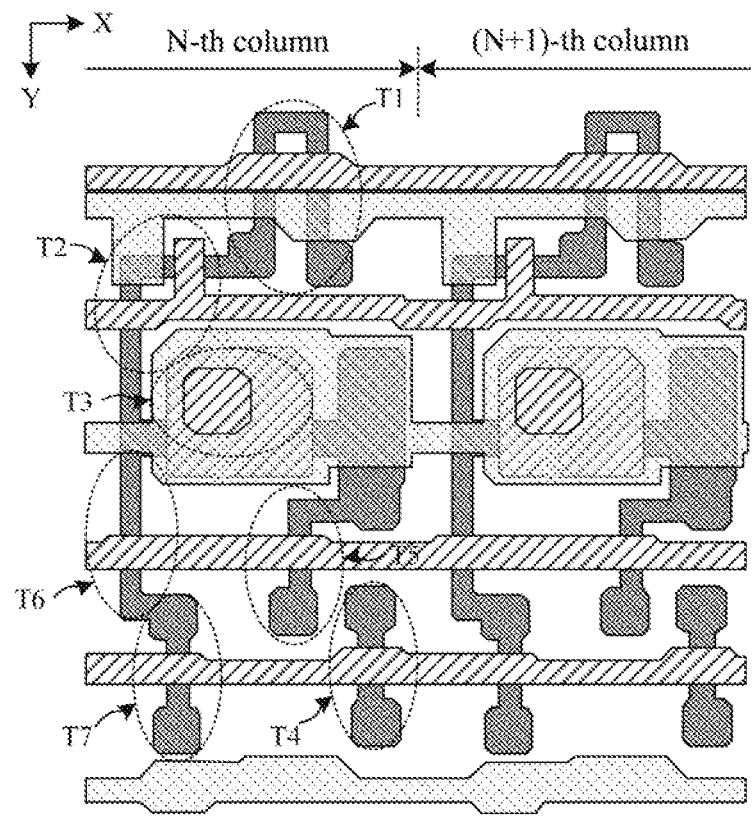
FIG. 10A and FIG. 10B are schematic diagrams of a display substrate after a pattern of a second conductive layer is formed according to the present disclosure.
Figure 10B:
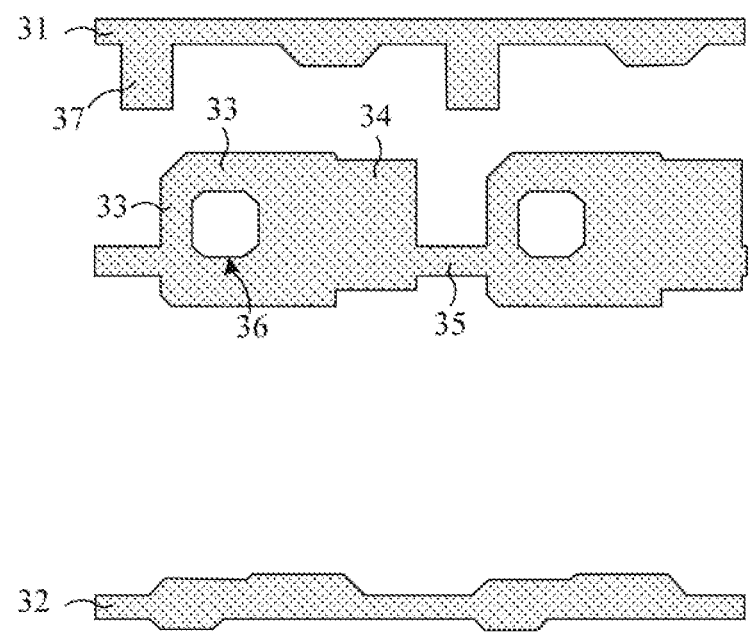

(13) A pattern of a second conductive layer is formed. In an exemplary implementation, forming the pattern of the second conductive layer may include: a third insulating thin film and a second conductive thin film are sequentially deposited on the base substrate on which the aforementioned patterns are formed, and the second conductive thin film is patterned through a patterning process to form a third insulating layer that covers the first conductive layer and the pattern of the second conductive layer disposed on the third insulating layer, as shown in FIG. 10A and FIG. 10B, and FIG. 10B is a schematic diagram of the second conductive layer in FIG. 10A. In an exemplary implementation, the second conductive layer may be referred to as a second gate metal (GATE2) layer.

In an exemplary implementation, the pattern of the second conductive layer of each circuit unit in the display area at least includes: a first initial signal line 31, a second initial signal line 32, a second electrode plate 33 of the first storage capacitor, a fourth electrode plate 34 of the second storage capacitor, an electrode plate connection line 35, and a shielding electrode 37.

In an exemplary implementation, shapes of the first initial signal line 31 and the second initial signal line 32 may be line shapes, main body portions of the first initial signal line 31 and the second initial signal line 32 may extend along the first direction X to form line shapes, respectively. The first initial signal line 31 may be located between the second scan signal line 22 and the third scan signal line 23 of the present circuit unit, and the second initial signal line 32 may be located on a side of the first scan signal line 21 of the present circuit unit away from the light emitting control line 24.

In an exemplary implementation, a profile shape of the second electrode plate 33 may be a rectangular shape, chamfers may be provided at corners of the rectangle, the second electrode plate 33 is located between the second scan signal line 22 and the light emitting control line 24 of the present circuit unit, an orthographic projection of the second electrode plate 33 on the base substrate is at least partially overlapped with an orthographic projection of the first electrode plate 25 on the base substrate, the second electrode plate 33 may serve as the other electrode plate of the first storage capacitor, and the first electrode plate 25 and the second electrode plate 33 constitute the first storage capacitor of the pixel drive circuit.

In an exemplary implementation, a profile shape of the fourth electrode plate 34 may be a rectangular shape, chamfers may be provided at corners of the rectangle, the fourth electrode plate 34 is located between the second scan signal line 22 and the light emitting control line 24 of the present circuit unit, an orthographic projection of the fourth electrode plate 34 on the base substrate is at least partially overlapped with an orthographic projection of the third electrode plate 18 on the base substrate, the fourth electrode plate 34 may serve as the other electrode plate of the second storage capacitor, and the third electrode plate 18 and the fourth electrode plate 34 constitute a second storage capacitor of the pixel drive circuit.

In an exemplary implementation, an area of an orthographic projection of the fourth electrode plate 34 on the base substrate may be smaller than an area of an orthographic projection of the first electrode plate 25 on the base substrate, and the area of the orthographic projection of the fourth electrode plate 34 on the base substrate may be smaller than an area of an orthographic projection of the second electrode plate 33 on the base substrate.

In an exemplary implementation, the second electrode plate 33 and the fourth electrode plate 34 may be of an interconnected integral structure, and an overall profile shape of the second electrode plate 33 and the fourth electrode plate 34 as the integral structure may be a rectangular shape.

In an exemplary implementation, the electrode plate connection line 35 may be disposed on a side of the fourth electrode plate 34 in the first direction X or may be disposed on a side of the second electrode plate 33 in an opposite direction of the first direction X. A first end of the electrode plate connection line 35 is connected with the fourth electrode plate 34 of the present circuit unit, and a second end of the electrode plate connection line 35 is connected with the second electrode plate 33 of an adjacent circuit unit after extending in the first direction X, or the first end of the electrode plate connection line 35 is connected with the second electrode plate 33 of the present circuit unit, and a second end of the electrode plate connection line 35 is connected with the fourth electrode plate 34 of the adjacent circuit unit after extending in an opposite direction of the first direction X. In this way, the second electrode plates 33 and the fourth electrode plates 34 of adjacent circuit units in a unit row are connected with each other. In an exemplary implementation, second electrode plates and fourth electrode plates of multiple circuit units in a unit row may form an interconnected integral structure through an electrode plate connection line. The second electrode plates and the fourth electrode plates in the integral structure may be reused as power supply signal connection lines, thus ensuring that multiple second electrode plates and fourth electrode plates in a unit row have a same potential and being beneficial to improve uniformity of a panel, avoiding a display defect of the display substrate, and ensuring a display effect of the display substrate.

In an exemplary implementation, an opening 36 is disposed on the second electrode plate 33 and may be located in a middle part of the second electrode plate 33, and the opening 36 may be in a shape of a rectangle, so that the second electrode plate 33 forms an annular structure. The opening 36 exposes the third insulating layer that covers the first electrode plate 25, and an orthographic projection of the first electrode plate 25 on the base substrate contains an orthographic projection of the opening 36 on the base substrate. In an exemplary implementation, the opening 36 is configured to accommodate a first via formed subsequently, and the first via is located within the opening 36 and exposes the first electrode plate 25, so that a first connection electrode formed subsequently is connected with the first electrode plate 25.

In an exemplary implementation, the shielding electrode 37 may be located on a side of the first initial signal line 31 close to the first scan signal line 22, and is connected with the first initial signal line 31, an orthographic projection of the shielding electrode 37 on the base substrate is at least partially overlapped with an orthographic projection of the second active layer between the two gate electrodes of the second transistor T2 on the base substrate. The shielding electrode 37 is configured to shield an influence of data voltage jump on the second transistor T2, avoiding the data voltage jump from influencing a normal operation of the pixel drive circuit, and improving a display effect.

Figure 11:
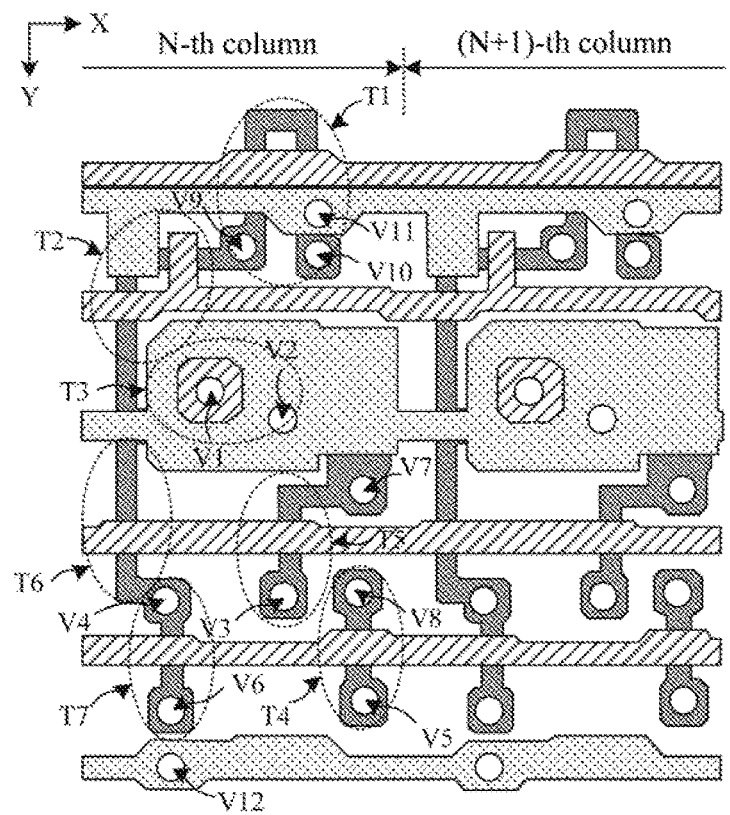
FIG. 11 is a schematic diagram of a display substrate after a pattern of a fourth insulating layer is formed according to the present disclosure.

(14) A pattern of a fourth insulating layer is formed. In an exemplary implementation, forming the pattern of the fourth insulating layer may include: a fourth insulating thin film is deposited on the base substrate on which the aforementioned patterns are formed, and the fourth insulating thin film is patterned through a patterning process, to form a fourth insulating layer that covers the second conductive layer, wherein multiple vias are disposed on each circuit unit, as shown in FIG. 11.

In an exemplary implementation, multiple vias of each circuit unit in the display area at least include: a first via V1, a second via V2, a third via V3, a fourth via V4, a fifth via V5, a sixth via V6, a seventh via V7, an eighth via V8, a ninth via V9, a tenth via V10, an eleventh via V11, and a twelfth via V12.

In an exemplary implementation, an orthographic projection of the first via V1 on the base substrate is located within a range of an orthographic projection of the opening 36 of the second electrode plate 33 on the base substrate, the fourth insulating layer and the third insulating layer within the first via V1 are etched away to expose a surface of the first electrode plate 25, and the first via V1 is configured such that the second electrode of the first transistor T1 formed subsequently is connected with the first electrode plate 25 through the first via.

In an exemplary implementation, an orthographic projection of the second via V2 on the base substrate is located within a range of an orthographic projection of the second electrode plate 33 on the base substrate, the fourth insulating layer within the second via V2 is etched away to expose a surface of the second electrode plate 33, and the second via V2 is configured such that a first electrode of the fifth transistor T5 formed subsequently is connected with the second electrode plate 33 through the second via.

In an exemplary implementation, an orthographic projection of the third via V3 on the base substrate is located within a range of an orthographic projection of a first region of the fifth active layer on the base substrate, the fourth insulating layer, the third insulating layer, and the second insulating layer within the third via V3 are etched away to expose a surface of the first region of the fifth active layer, and the third via V3 is configured such that the first electrode of the fifth transistor T5 formed subsequently is connected with the first region of the fifth active layer through the third via.

In an exemplary implementation, an orthographic projection of the fourth via V4 on the base substrate is located within a range of an orthographic projection of a second region of the sixth active layer (which is also a second region of the seventh active layer) on the base substrate, the fourth insulating layer, the third insulating layer, and the second insulating layer within the fourth via V4 are etched away to expose a surface of the second region of the sixth active layer, and the fourth via V4 is configured such that a second electrode of the sixth transistor T6 (which is also a second electrode of the seventh transistor T7) formed subsequently is connected with the sixth active layer through the fourth via.

In an exemplary implementation, an orthographic projection of the fifth via V5 on the base substrate is located within a range of an orthographic projection of a first region of the fourth active layer on the base substrate, the fourth insulating layer, the third insulating layer, and the second insulating layer within the fifth via V5 are etched away to expose a surface of a first region of the fourth active layer, and the fifth via V5 is configured such that a first electrode of the fourth transistor T4 formed subsequently is connected with the first region of the fourth active layer through the fifth via.

In an exemplary implementation, an orthographic projection of the sixth via V6 on the base substrate is located within a range of an orthographic projection of a first region of the seventh active layer on the base substrate, the fourth insulating layer, the third insulating layer, and the second insulating layer within the sixth via V6 are etched away to expose a surface of the first region of the seventh active layer, and the sixth via V6 is configured such that a first electrode of the seventh transistor T7 formed subsequently is connected with the first region of the seventh active layer through the sixth via.

In an exemplary implementation, an orthographic projection of the seventh via V7 on the base substrate is located within a range of an orthographic projection of the first region of the third active layer (also the second region of the fifth active layer) on the base substrate. The fourth insulating layer, the third insulating layer and the second insulating layer in the seventh via V7 are etched away to expose a surface of the first region of the third active layer, the seventh via V7 is configured such that the first electrode of the third transistor T3 formed subsequently (also the second electrode of the fifth transistor T5) is connected with the first region of the third active layer through the seventh via V7.

In an exemplary implementation, an orthographic projection of the eighth via V8 on the base substrate is located within a range of an orthographic projection of the second region of the fourth active layer on the base substrate, the fourth insulating layer, the third insulating layer and the second insulating layer in the eighth via V8 are etched away to expose a surface of the second region of the fourth active layer, and the eighth via V8 is configured such that a second electrode of the fourth transistor T4 formed subsequently is connected with the second region of the fourth active layer through the eighth via.

In an exemplary implementation, an orthographic projection of the ninth via V9 on the base substrate is located within a range of an orthographic projection of a second region of the first active layer (which is also a first region of the second active layer) on the base substrate, the fourth insulating layer, the third insulating layer, and the second insulating layer within the ninth via V9 are etched away to expose a surface of the second region of the first active layer, and the ninth via V9 is configured such that a second electrode of the first transistor T1 (which is also a first electrode of the second transistor T2) formed subsequently is connected with the first active layer through the ninth via.

In an exemplary implementation, an orthographic projection of the tenth via V10 on the base substrate is located within a range of an orthographic projection of a first region of the first active layer on the base substrate, the fourth insulating layer, the third insulating layer, and the second insulating layer within the tenth via V10 are etched away to expose a surface of the first region of the first active layer, and the tenth via V10 is configured such that a first electrode of the first transistor T1 formed subsequently is connected with the first region of the first active layer through the tenth via.

In an exemplary implementation, an orthographic projection of the eleventh via V11 on the base substrate is located within a range of an orthographic projection of the first initial signal line 31 on the base substrate, the fourth insulating layer within the eleventh via V11 is etched away to expose a surface of the first initial signal line 31, and the eleventh via V11 is configured such that the first electrode of the first transistor T1 formed subsequently is connected with the first initial signal line 31 through the eleventh via.

In an exemplary implementation, an orthographic projection of the twelfth via V12 on the base substrate is located within a range of an orthographic projection of the second initial signal line 32 on the base substrate, the fourth insulating layer within the twelfth via V12 is etched away to expose a surface of the second initial signal line 32, and the twelfth via V12 is configured such that the first electrode of the seventh transistor T7 formed subsequently is connected with the second initial signal line 32 through the twelfth via.

Figure 12A:
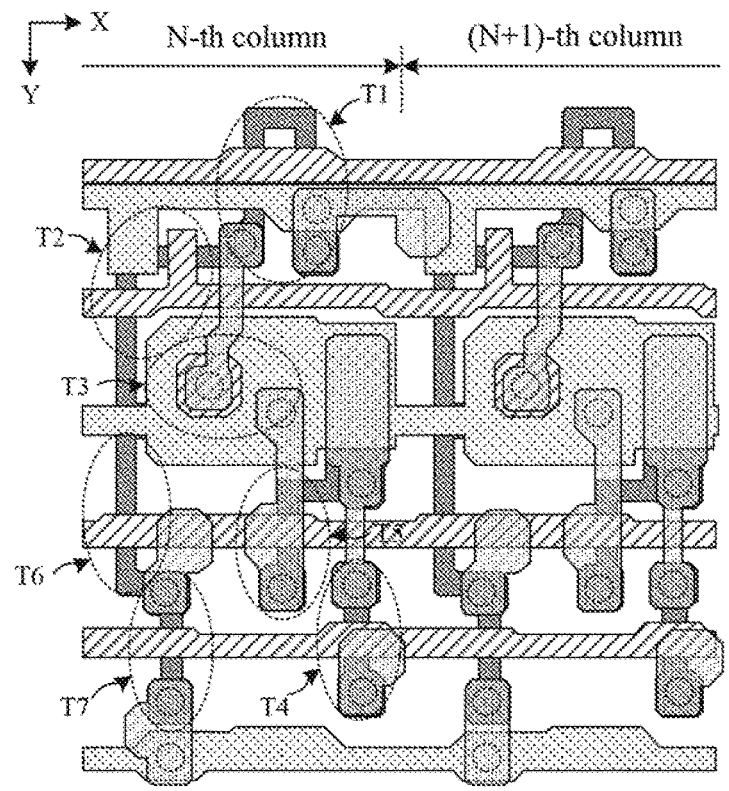
FIG. 12A and FIG. 12B are schematic diagrams of a display substrate after a pattern of a third conductive layer is formed according to the present disclosure.
Figure 12B:
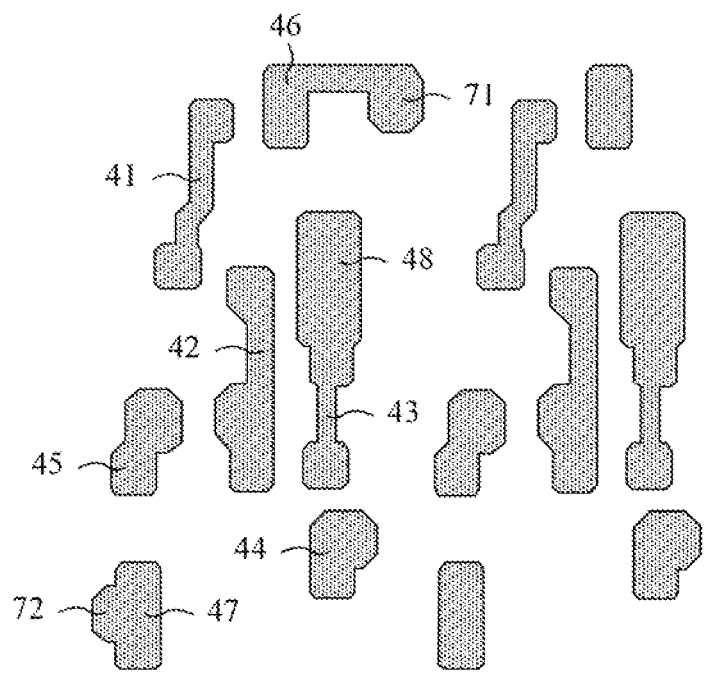

(15) A pattern of a third conductive layer is formed. In an exemplary implementation, forming the third conductive layer may include: a third conductive thin film is deposited on the base substrate on which the aforementioned patterns are formed, the third conductive thin film is patterned through a patterning process to form the third conductive layer disposed on the fourth insulating layer, as shown in FIG. 12A and FIG. 12B, and FIG. 12B is a schematic diagram of the third conductive layer in FIG. 12A. In an exemplary implementation, the third conductive layer may be referred to as a first source-drain metal (SD1) layer.

In an exemplary implementation, the patterns of the third conductive layers of multiple circuit units in the display area each may include: a first connection electrode 41, a second connection electrode 42, a third connection electrode 43, a fourth connection electrode 44, a fifth connection electrode 45, a sixth connection electrode 46, a seventh connection electrode 47 and a fifth electrode plate 48.

In an exemplary implementation, a shape of the first connection electrode 41 may be a strip shape, a main body portion of the first connection electrode 41 extends along the second direction Y to form the strip shape, a first end of the first connection electrode 41 is connected with the first electrode plate 25 through the first via V1, and a second end of the first connection electrode 41 is connected with the second region of the first active layer (which is also the first region of the second active layer) through the ninth via V9. In an exemplary implementation, the first connection electrode 41 may serve as a second node N2 in the pixel drive circuit of the present disclosure, and the first connection electrode 41 may simultaneously serve as a second electrode of the first transistor T1 and a first electrode of the second transistor T2, so that the second electrode of the first transistor T1, the first electrode of the second transistor T2 and the first electrode plate 25 (a gate electrode of the third transistor T3) have a same potential.

In an exemplary implementation, a shape of the second connection electrode 42 may be a strip shape, a main body portion of the second connection electrode 42 extends along the second direction Y to form the strip shape, a first end of the second connection electrode 42 is connected with the second electrode plate 33 through the second via V2, and a second end of the second connection electrode 42 is connected with the first region of the fifth active layer through the third via V3. In an exemplary implementation, the second connection electrode 42 may serve as the first electrode of the fifth transistor T5, so that the second electrode plate 33, the fourth electrode plate 34 and the first electrode of the fifth transistor T5 have a same potential, and the second connection electrode 42 is configured to be connected with a first power supply line formed subsequently. Since the second electrode plate 33 has a potential of the first power supply line and the first electrode plate 25 has a potential of the second node N2, the first electrode plate 25 and the second electrode plate 33 constitute a first storage capacitor of the pixel drive circuit.

In an exemplary implementation, a shape of the third connection electrode 43 may be a strip shape, a main body portion of the third connection electrode 43 extends along the second direction Y to form the strip shape, a first end of the third connection electrode 43 is connected with the first region of the third active layer through the seventh via V7, and a second end of the third connection electrode 43 is connected with the second region of the fourth active layer through the eighth via V8. In an exemplary implementation, the third connection electrode 43 may serve as a first node N1 of the pixel drive circuit of the present disclosure, and the third connection electrode 43 may simultaneously serve as a first electrode of the third transistor T3, a second electrode of the fourth transistor T4, and a second electrode of the fifth transistor T5, so that the first electrode of the third transistor T3, the second electrode of the fourth transistor T4, and the second electrode of the fifth transistor T5 have a same potential.

In an exemplary implementation, a shape of the fourth connection electrode 44 may be a rectangular shape, and the fourth connection electrode 44 is connected with the first region of the fourth active layer through the fifth via V5. The fourth connection electrode 44 may serve as the first electrode of the fourth transistor T4, and the fourth connection electrode 44 is configured to be connected with an eleventh connection electrode formed subsequently.

In an exemplary implementation, a shape of the fifth connection electrode 45 may be a rectangular shape, and the fifth connection electrode 45 is connected with the second region of the sixth active layer (which is also the second region of the seventh active layer) through the fourth via V4. The fifth connection electrode 45 may serve as the second electrode of the sixth transistor T6 (which is also the second electrode of the seventh transistor T7), and the fifth connection electrode 45 is configured to be connected with a twelfth connection electrode formed subsequently.

In an exemplary implementation, a shape of the sixth connection electrode 46 may be a strip shape, a main body portion of the sixth connection electrode 46 extends along the second direction Y to form the strip shape, a first end of the six connection electrode 46 is connected with the first region of the first active layer through the tenth via V10, and a second end of the sixth connection electrode 46 is connected with the first initial signal line 31 through the eleventh via V11. The sixth connection electrode 46 may serve as the first electrode of the first transistor T1, thereby it can be achieved that the first initial signal line 31 writes a first initial signal into the first electrode of the first transistor T1.

In an exemplary implementation, a shape of the seventh connection electrode 47 may be a strip shape, a main body portion of the seventh connection electrode 47 extends along the second direction Y to form the strip shape, a first end of the seventh connection electrode 47 is connected with the first region of the seventh active layer through the sixth via V6, and a second end of the seventh connection electrode 47 is connected with the second initial signal line 32 through the twelfth via V12. The seventh connection electrode 47 may serve as the first electrode of the seventh transistor T7, thereby it can be achieved that the second initial signal line 32 writes a second initial signal into the first electrode of the seventh transistor T7.

In an exemplary implementation, a shape of the fifth electrode plate 48 may be a rectangular shape, chamfers may be provided at corners of the rectangle, and the fifth electrode plate 48 may be located on a side of the third connection electrode 43 of the present circuit unit in an opposite direction of the second direction Y (a side away from the fourth transistor T4), an orthographic projection of the fifth electrode plate 48 on the base substrate is at least partially overlapped with an orthographic projection of the fourth electrode plate 34 on the base substrate, the fifth electrode plate 48 may serve as the other electrode plate of a second storage capacitor, and the fourth electrode plate 34 and the fifth electrode plate 48 constitute another second storage capacitor of the pixel drive circuit.

In an exemplary implementation, an area of an orthographic projection of the fifth electrode plate 48 on the base substrate may be smaller than an area of an orthographic projection of the first electrode plate 25 on the base substrate.

In an exemplary implementation, the third connection electrode 43 and the fifth electrode plate 48 may be of an interconnected integral structure. Since the third electrode plate 18 is directly connected with the second region of the fifth active layer, the fifth electrode plate 48 is connected with the third connection electrode 43, and the third connection electrode 43 is connected with the first region of the fifth active layer through a via, the third electrode plate 18 and the fifth electrode plate 48 have a same potential, the fourth electrode plate 34 has a potential of the first power supply, the third electrode plate 18 and the fourth electrode plate 34 constitute a second storage capacitor of the pixel drive circuit, the fifth electrode plate 48 and the fourth electrode plate 34 constitute another second storage capacitor of the pixel drive circuit, and the two second storage capacitors are connected in parallel to form a complete second storage capacitor of the pixel drive circuit. By adopting the second storage capacitor with a parallel structure, the present disclosure not only effectively utilizes the wiring space, but also effectively increases a capacitance value of the second storage capacitor, which can make a writing of data voltage more sufficient and ensure a writing quality of data.

In an exemplary implementation, the capacitance value of the second storage capacitor may be less than a capacitance value of the first storage capacitor.

In an exemplary implementation, the capacitance value of the second storage capacitor may be about 20% to 70% of the capacitance value of the first storage capacitor. For example, the capacitance value of the second storage capacitor 20 may be about 30% to 50% of the capacitance value of the first storage capacitor 10.

In some possible exemplary implementation, the second storage capacitor may include only the third electrode plate 18 and fourth electrode plate 34, or the second storage capacitor may include only the fifth electrode plate 48 and the fourth electrode plate 34, which is not limited here in the present disclosure.

In an exemplary implementation, the pattern of the third conductive layer of at least one circuit unit may further include a first initial electrode 71 and a second initial electrode 72.

In an exemplary implementation, a shape of the first initial electrode 71 may be a strip shape, a main body portion of the first initial electrode 71 extends along the first direction X to form the strip shape, and may be disposed on a side of the sixth connection electrode 46 in the first direction X. A first end of the first initial electrode 71 is connected with a sixth connection electrode 46, a second end of the first initial electrode 71 extends to an adjacent circuit unit along the first direction X, and the first initial electrode 71 is configured to be connected with a first connection line formed subsequently, so that the first initial signal line and the first connection line form a mesh communicated structure. For example, a first end of the first initial electrode 71 is connected with a sixth connection electrode 46 in a circuit unit in the N-th column, and a second end of the first initial electrode 71 is located in a circuit unit in the (N+1)-th column and configured to be connected with a first connection line formed subsequently in the circuit unit in the (N+1)-th column.

In an exemplary implementation, a shape of the second initial electrode 72 may be a block shape, the second initial electrode 72 may be disposed on a side of the seventh connection electrode 47 in an opposite direction of the first direction X, and may be connected with the seventh connection electrode 47, and the second initial electrode 72 is configured to be connected with the second connection line formed subsequently, so that the second initial signal line and the second connection line form a mesh communicated structure. For example, the second initial electrode 72 may be located in a circuit unit in the N-th column, connected with a sixth connection electrode 46 in the circuit unit in the N-th column, configured to be connected with a second connection line formed subsequently in the circuit unit in the N-th column.

Figure 13:
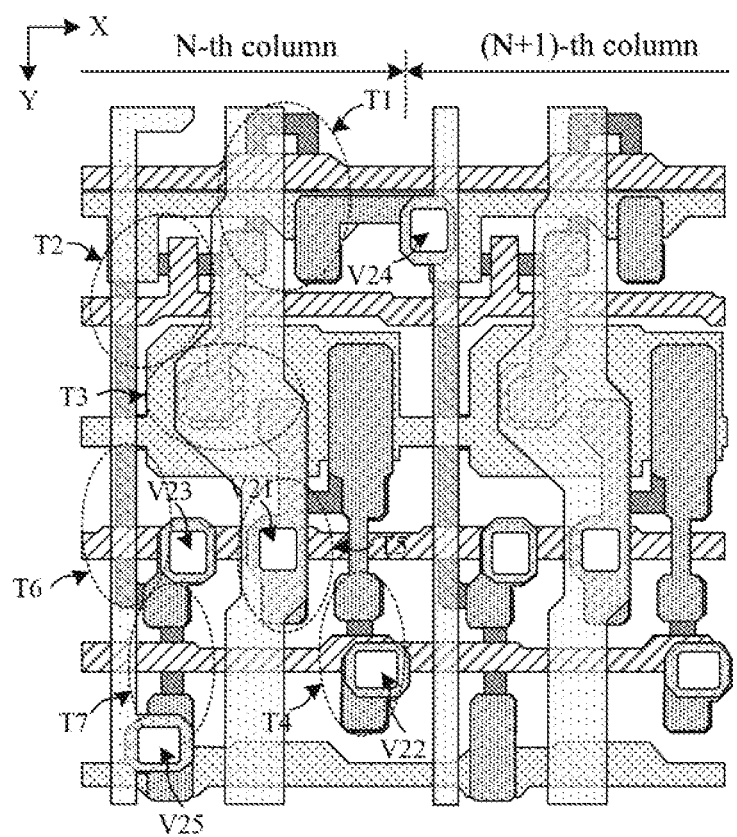
FIG. 13 is a schematic diagram of a display substrate after a pattern of a fifth insulating layer is formed according to the present disclosure.

(16) A pattern of a fifth insulating layer is formed. In an exemplary implementation, forming the pattern of the fifth insulating layer may include: a fifth insulating film is deposited on the base substrate on which the aforementioned patterns are formed, the fifth insulating film is patterned through a patterning process to form a fifth insulating layer that covers the third conductive layer, wherein multiple vias are disposed on each circuit unit, as shown in FIG. 13.

In an exemplary implementation, the multiple vias in each circuit unit in the display area at least include a twenty-first via V21, a twenty-second via V22, and a twenty-third via V23.

In an exemplary implementation, an orthographic projection of the twenty-first via V21 on the base substrate is located within a range of an orthographic projection of the second connection electrode 42 on the base substrate, the fifth insulating layer within the twenty-first via V21 is removed to expose a surface of the second connection electrode 42, and the twenty-first via V21 is configured such that a first power supply line formed subsequently is connected with the second connection electrode 42 through the twenty-first via.

In an exemplary implementation, an orthographic projection of the twenty-second via V22 on the base substrate is located within a range of an orthographic projection of the fourth connection electrode 44 on the base substrate, the fifth insulating layer in the twenty-second via V22 is removed to expose a surface of the fourth connection electrode 44, and the twenty-second via V22 is configured such that an eleventh connection electrode formed subsequently is connected with the fourth connection electrode 44 through the twenty-second via.

In an exemplary implementation, an orthographic projection of the twenty-third via V23 on the base substrate is located within a range of an orthographic projection of the fifth connection electrode 45 on the base substrate, the fifth insulating layer within the twenty-third via V23 is removed to expose a surface of the fifth connection electrode 45, and the twenty-third via V23 is configured such that a twelfth connection electrode formed subsequently is connected with the fifth connection electrode 45 through the twenty-third via.

In an exemplary implementation, the fifth insulating layer of at least one circuit unit is further provided with a twenty-fourth via V24, and the fifth insulating layer of at least another circuit unit is further provided with a twenty-fifth via V25.

In an exemplary implementation, an orthographic projection of the twenty-fourth via V24 on the base substrate is located within a range of an orthographic projection of the first initial electrode 71 on the base substrate, the fifth insulating layer within the twenty-fourth via V24 is removed to expose a surface of the first initial electrode 71, and the twenty-fourth via V24 is configured such that a first connection line formed subsequently is connected with the first initial electrode 71 through the twenty-fourth via V24. For example, the twenty-fourth via V24 may be located in a circuit unit in the (N+1)-th column, so that the first connection line located in the circuit units in the (N+1)-th column is connected with first initial electrodes 71 in multiple unit rows through multiple twenty-fourth vias V24.

In an exemplary implementation, an orthographic projection of the twenty-fifth via V25 on the base substrate is located within a range of an orthographic projection of the second initial electrode 72 on the base substrate, the fifth insulating layer within the twenty-fifth via V25 is removed to expose a surface of the second initial electrode 72, and the twenty-fifth via V25 is configured such that a second connection line formed subsequently is connected with the second initial electrode 72 through the twenty-fifth via. For example, the twenty-fifth via V25 may be located in a circuit unit in the N-th column, so that the second connection line located in the circuit units in the N-th column is connected with second initial electrodes 72 in multiple unit rows through multiple twenty-fifth vias V25.

Figure 14A:
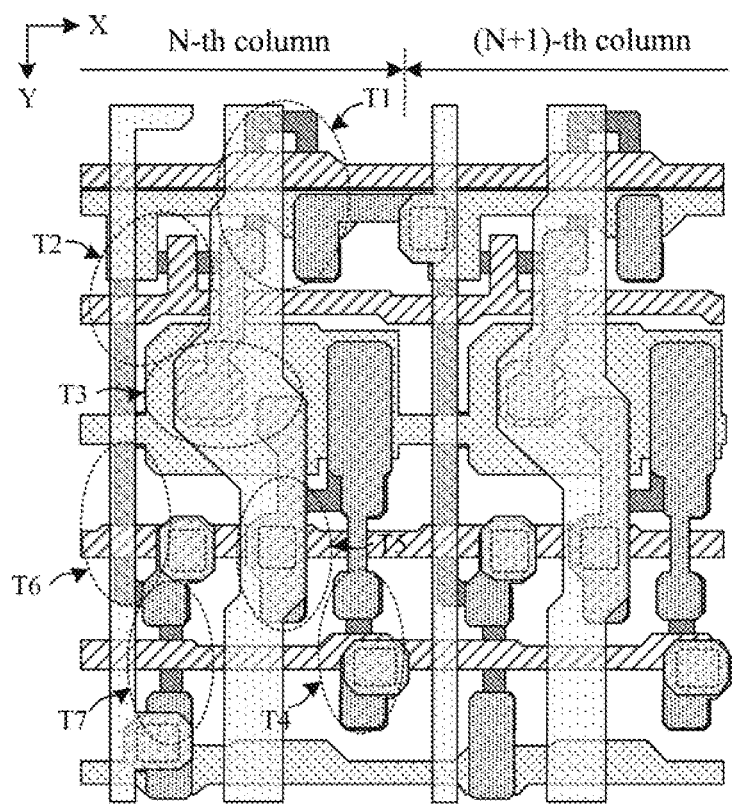
FIG. 14A and FIG. 14B are schematic diagrams of a display substrate after a pattern of a fourth conductive layer is formed according to the present disclosure.
Figure 14B:
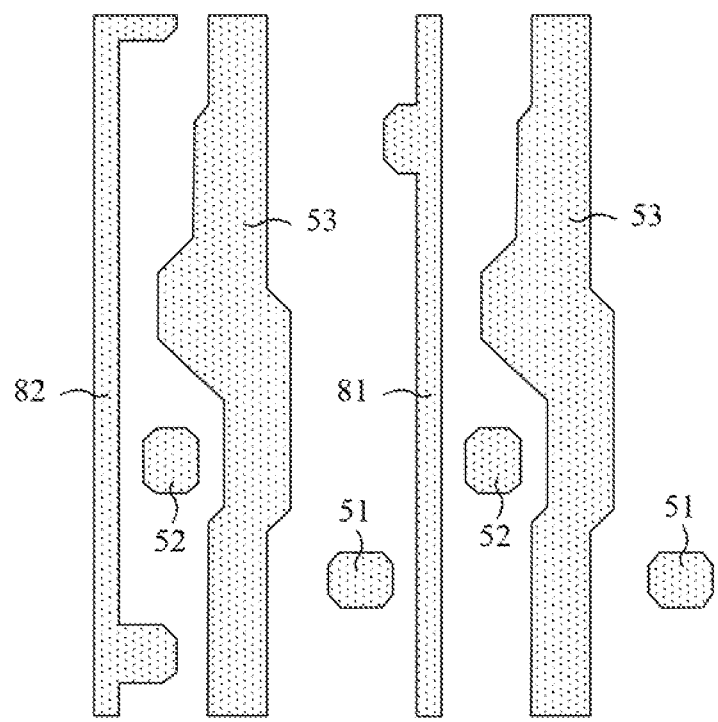

(17) A pattern of a fourth conductive layer is formed. In an exemplary implementation, forming the pattern of the fourth conductive layer may include: a fourth conductive thin film is deposited on the base substrate on which the aforementioned patterns are formed, the fourth conductive thin film is patterned through a patterning process to form the fourth conductive layer disposed on the fifth insulating layer, as shown in FIG. 14A and FIG. 14B, and FIG. 14B is a schematic diagram of the fourth conductive layer in FIG. 14A. In an exemplary implementation, the fourth conductive layer may be referred to as a second source-drain metal (SD2) layer.

In an exemplary implementation, the patterns of the fourth conductive layers of multiple circuit units in the display area each may include: an eleventh connection electrode 51, a twelfth connection electrode 52, and a first power supply line 53.

In an exemplary implementation, a shape of the eleventh connection electrode 51 may be a rectangular shape. The eleventh connection electrode 51 may be connected with the fourth connection electrode 44 through the twenty-second via V22. The eleventh connection electrode 51 is configured to be connected with a data signal line formed subsequently.

In an exemplary implementation, a shape of the twelfth connection electrode 52 may be a rectangular shape. The twelfth connection electrode 52 may be connected with the fifth connection electrode 45 through the seventy-third via V23. The twelfth connection electrode 52 is configured to be connected with an anode connection electrode formed subsequently.

In an exemplary implementation, a shape of the first power supply line 53 may be a polyline, a main body portion of the first power supply line 53 extends along the second direction Y to form the polyline, and the first power supply line 53 is connected with the second connection electrode 42 through the twenty-first via V21. Since the second connection electrode 42 is respectively connected with the second electrode plate and the first region of the fifth active layer through a via, it is achieved that the first power supply line 53 writes a power supply signal into the first electrode of the fifth transistor T5, and the first power supply line 53, the second electrode plate of the first storage capacitor and the fourth electrode plate of the second storage capacitor have a same potential.

In an exemplary implementation, an orthographic projection of the first power supply line 53 on the base substrate is at least partially overlapped with an orthographic projection of the first connection electrode 41 on the base substrate. The first power supply line 53 can effectively shield influence of other signals on the second node N2 in the pixel drive circuit, which avoids the influence of data voltage jump on a potential of the second node N2 in the pixel drive circuit, and improves the display effect.

In an exemplary implementation, since there is only a thin fifth insulating layer between the third conductive layer and the fourth conductive layer, a parasitic capacitance between the first connection electrode 41 and the first power supply line 53 is large, thereby the second node N2 can be better stabilized.

In an exemplary implementation, the first power supply line 53 may be of an unequal width design, and the first power supply line 53 with the unequal width design can not only facilitate a layout of a pixel structure, but also reduce a parasitic capacitance between the first power supply line and a data signal line.

In an exemplary implementation, the pattern of the fourth conductive layer of at least one circuit unit may further include a first connection line 81.

In the exemplary implementation, the first connection line 81 may be located in a circuit unit in the (N+1)-th column, a shape of the first connection line 81 may be a line shape, a main body portion of the first connection line 81 extends along the second direction Y to form the line shape, and the first connection line 81 is connected with the first initial electrode 71 through the twenty-fourth via V24. Since the first initial electrode 71 is connected with the sixth connection electrode 46, and the sixth connection electrode 46 is connected with the first initial signal line 31 through a via, connection between the first initial signal line 31 of which the main body portion extends along the first direction X and the first connection line 81 of which the main body portion extends along the second direction Y is achieved. Thus, the first connection line 81 may be connected with first initial signal lines 31 in multiple unit rows through the first initial electrode 71 and the sixth connection electrode 46, so that the first initial signal line 31 and the first connection line 81 form a mesh structure for transmitting the first initial signal in the display area, which can not only effectively reduce a resistance of the first initial signal line and reduce a voltage drop of the first initial signal, but also effectively improve uniformity of the first initial signal in the display substrate, effectively improve display uniformity and improve display performance and display quality.

In an exemplary implementation, the pattern of the fourth conductive layer of at least one circuit unit may further include a second connection line 82.

In an exemplary implementation, the second connection line 82 may be located in a circuit unit in the N-th column, a shape of the second connection line 82 may be a line shape, a main body portion of the second connection line 82 extends along the second direction Y to form the line shape, and the second connection line 82 is connected with the second initial electrode 72 through the twenty-fifth via V25. Since the second initial electrode 72 is connected with the seventh connection electrode 47, and the seventh connection electrode 47 is connected with the second initial signal line 32 through a via, connection between the second initial signal line 32 of which the main body portion extends along the first direction X and the second connection line 82 of which the main body portion extends along the second direction Y is achieved. Thus, the second connection line 82 may be connected with second initial signal lines 32 in multiple unit rows through the second initial electrode 72 and the seventh connection electrode 47, so that the second initial signal line 32 and the second connection line 82 form a mesh structure for transmitting the second initial signal in the display area, which can not only effectively reduce a resistance of the second initial signal line and reduce a voltage drop of the second initial signal, but also effectively improve uniformity of the second initial signal in the display substrate, effectively improve display uniformity and improve display performance and display quality.

In an exemplary implementation, the first connection line 81 may be disposed in a circuit unit of an odd-numbered unit column ((N+1)-th column), the second connection line 82 may be disposed in a circuit unit of an even-numbered unit column (N-th column), or the first connection line 81 may be disposed in a circuit unit of an even-numbered unit column (N-th column), and the second connection line 82 may be disposed in a circuit unit of an odd-numbered unit column ((N+1)-th column).

In an exemplary implementation, a first initial signal line 31 and a second initial signal line 32 of the second conductive layer may be disposed in each unit row, a first connection line 81 and a second connection line 82 of the fourth conductive layer may be alternately disposed in each unit column, multiple first connection lines 81 in multiple odd-numbered unit columns are respectively connected with multiple first initial signal lines 31 in multiple unit rows, and multiple second connection lines 82 in multiple even-numbered unit columns are respectively connected with multiple second initial signal lines 32 in multiple unit rows, so that a mesh structure for transmitting the first initial signal and a mesh structure for transmitting the second initial signal are simultaneously formed in the display area, a voltage drops of the first initial signal and the second initial signal are reduced, the second node N2 can be reset in a shorter time, which is beneficial to a high frequency display, and the fourth node N4 can be reset in a shorter time, which is beneficial to improving the low-greyscale display effect.

Figure 15:
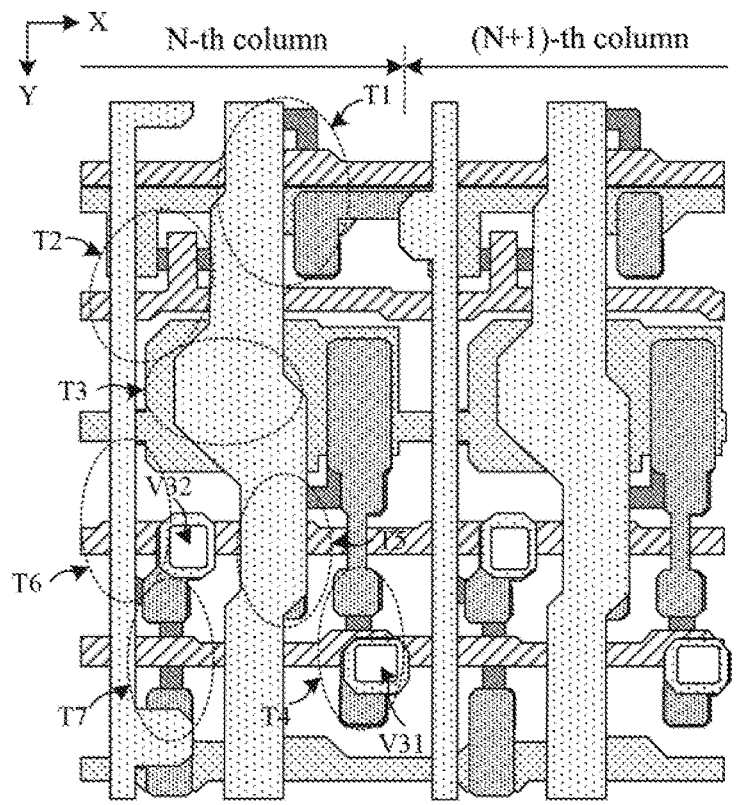
FIG. 15 is a schematic diagram of a display substrate after a pattern of a first planarization layer is formed according to the present disclosure.

(18) A pattern of a first planarization layer is formed. In an exemplary implementation, forming the pattern of the first planarization layer may include: coating a first planarization thin film on the base substrate on which the aforementioned patterns are formed, the first planarization thin film is patterned through a patterning process to form the first planarization layer that covers the fourth conductive layer, and the first planarization layer is provided with multiple vias, as shown in FIG. 15.

In an exemplary implementation, the multiple vias in each circuit unit in the display area at least include a thirty-first via V31 and a thirty-second via V32.

In an exemplary implementation, an orthographic projection of the thirty-first via V31 on the base substrate is located within a range of an orthographic projection of an eleventh connection electrode 51 on the base substrate, the first planarization layer in the thirty-first via V31 is removed to expose a surface of the eleventh connection electrode 51, and the thirty-first via V31 is configured such that a data signal line formed subsequently is connected with the eleventh connection electrode 51 through the thirty-first via.

In an exemplary implementation, an orthographic projection of the thirty-second via V32 on the base substrate is located within a range of an orthographic projection of a twelfth connection electrode 52 on the base substrate, the first planarization layer in the thirty-second via V32 is removed to expose a surface of the twelfth connection electrode 52, and the thirty-second via V32 is configured such that an anode connection electrode formed subsequently is connected with the twelfth connection electrode 52 through the thirty-second via.

Figure 16A:
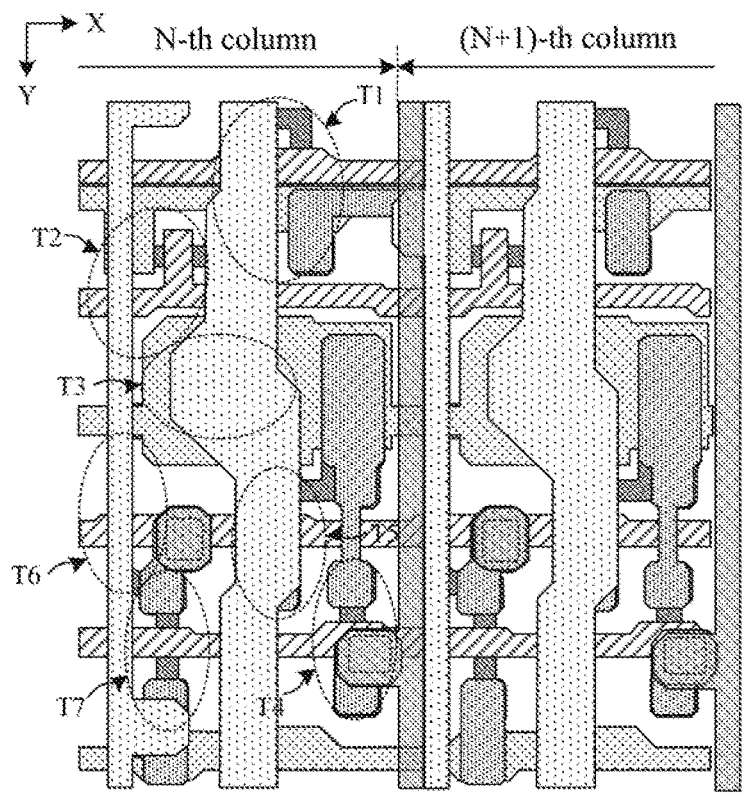
FIG. 16A and FIG. 16B are schematic diagrams of a display substrate after a pattern of a fifth conductive layer is formed according to the present disclosure.
Figure 16B:
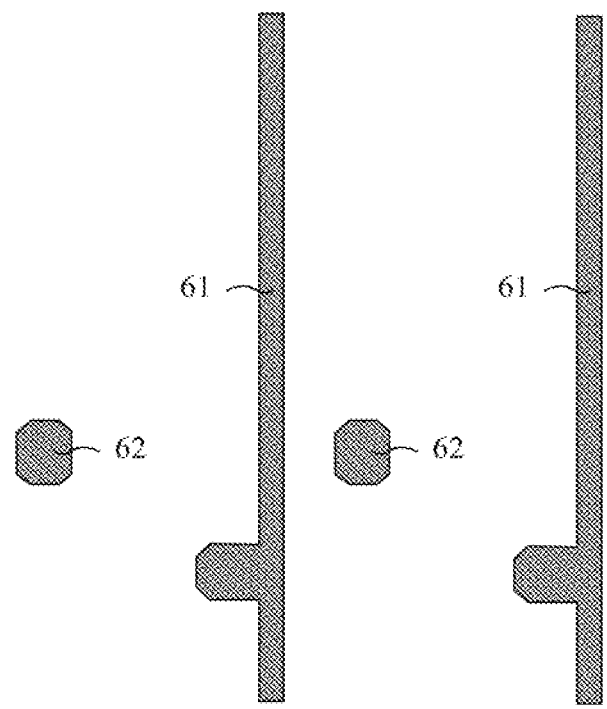

(19) A pattern of a fifth conductive layer is formed. In an exemplary implementation, forming the pattern of the fifth conductive layer may include: a fifth conductive thin film is deposited on the base substrate on which the aforementioned patterns are formed, the fifth conductive thin film is patterned through a patterning process to form a fifth conductive layer disposed on the first planarization layer, as shown in FIG. 16A and FIG. 16B, and FIG. 16B is a schematic diagram of the fifth conductive layer in FIG. 16A. In an exemplary implementation, the fifth conductive layer may be referred to as a third source-drain metal (SD3) layer.

In an exemplary implementation, the pattern of the fifth conductive layer of each circuit unit in the display area may include a data signal line 61 and an anode connection electrode 62.

In an exemplary implementation, a shape of the data signal line 61 may be a straight line shape, a main body portion of the data signal line 61 extends along the second direction Y to form the straight line shape, and the data signal line 61 is connected with the eleventh connection electrode 51 through the thirty-first via V31. Since the eleventh connection electrode 51 is connected with the fourth connection electrode 44 through a via, and the fourth connection electrode 44 is connected with the first region of the fourth active layer through a via, it is realized that the data signal line 61 writes a data signal into the first electrode of the fourth transistor T4. By disposing the data signal line in the fifth conductive layer and disposing the first connection line and the second connection line in the fourth conductive layer, the present disclosure can avoid signal interference caused by the data signal line and the initial signal line being disposed in a same conductive layer. Since there is a thick first planarization layer spaced between the fifth conductive layer and the fourth conductive layer, parasitic capacitances between the data signal line, and the signal line and the electrode in other film layers can be reduced, which is not only beneficial to improving a quality of data writing, but also can reduce an influence of a data jump voltage on key nodes of a pixel drive circuit.

In an exemplary implementation, an orthographic projection of at least one data signal line 61 on the base substrate is at least partially overlapped with an orthographic projection of the first connection line 81 on the base substrate, and the orthographic projection of the at least one data signal line 61 on the base substrate is at least partially overlapped with an orthographic projection of the second connection line 82 on the base substrate.

In an exemplary implementation, the orthographic projection of the at least one data signal line 61 on the base substrate may be located within a range of the orthographic projection of the first connection line 81 on the base substrate, and the orthographic projection of the at least one data signal line 61 on the base substrate may be located within a range of the orthographic projection of the second connection line 82 on the base substrate, i.e., the data signal line of the fifth conductive layer is completely overlapped with the initial signal connection line of the fourth conductive layer to increase a transmittance of the display substrate.

In an exemplary implementation, a shape of the anode connection electrode 62 may be a rectangular shape, and the anode connection electrode 62 is connected with the twelfth connection electrode 52 through the thirty-second via V32. Since the twelfth connection electrode 52 is connected with the fifth connection electrode 45 through a via, and the fifth connection electrode 45 is connected with the second region of the sixth active layer through a via, a connection between the anode connection electrode 62 and a second electrode of the sixth transistor T6 is realized. In an exemplary implementation, the anode connection electrode 62 is configured to be connected with an anode formed subsequently, thereby the pixel drive circuit can drive a light emitting device.

The subsequent manufacturing process may include: a pattern of a second planarization layer is formed. In an exemplary implementation, forming the pattern of the second planarization layer may include: coating a second planarization thin film on the base substrate on which the aforementioned patterns are formed, the second planarization thin film is patterned through a patterning process to form the second planarization layer that covers the fifth conductive layer, wherein the second planarization layer is provided with multiple anode vias, an orthographic projection of an anode via on the base substrate may be located within a range of an orthographic projection of the anode connection electrode on the base substrate, the second planarization layer in the anode via is removed to expose a surface of the anode connection electrode, and the anode via is configured such that the anode formed subsequently is connected with the anode connection electrode through the anode via.

So far, the drive circuit layer has been manufactured on the base substrate. On a plane parallel to the display substrate, the drive circuit layer may include multiple circuit units, each of which may include a pixel drive circuit, and a first scan signal line, a second scan signal line, a third scan signal line, a light emitting control line, a data signal line, a first power supply line, a first initial signal line, and a second initial signal line that are connected with the pixel drive circuit. On a plane perpendicular to the display substrate, the drive circuit layer may at least include a first insulating layer, a semiconductor layer, a second insulating layer, a first conductive layer, a third insulating layer, a second conductive layer, a fourth insulating layer, a third conductive layer, a fifth insulating layer, a fourth conductive layer, a first planarization layer, a fifth conductive layer and a second planarization layer which are sequentially stacked on the base substrate.

In an exemplary implementation, the base substrate may be a flexible base substrate, or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (PI), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the semiconductor layer may be amorphous silicon (a-si).

In an exemplary implementation, the first conductive layer, the second conductive layer, the third conductive layer, the fourth conductive layer, and the fifth conductive layer may be made of a metal material, such as any one or more of Argentum (Ag), Copper (Cu), Aluminum (Al), and Molybdenum (Mo), or an alloy material of the above-mentioned metals, such as Aluminum-Neodymium alloy (AlNd) or Molybdenum-Niobium alloy (MoNb), and may be a single-layer structure, or a multilayer composite structure such as Mo/Cu/Mo. The first insulating layer, the second insulating layer, the third insulating layer, the fourth insulating layer, and the fifth insulating layer may be made of any one or more of Silicon Oxide (SiOx), Silicon Nitride (SiNx), and Silicon Oxynitride (SiON), and may be a single layer, a multi-layer, or a composite layer. The first insulating layer is referred to as a buffer layer, the second insulating layer and the third insulating layer are referred to as gate insulating (GI) layers, the fourth insulating layer is referred to as an interlayer dielectric (ILD) layer, and the fifth insulating layer is referred to as a passivation (PVX) layer. The first planarization layer and the second planarization layer may be made of an organic material, such as resin. An active layer may be made of a material such as amorphous Indium Gallium Zinc Oxide (a-IGZO), Zinc Oxynitride (ZnON), Indium Zinc Tin Oxide (IZTO), amorphous Silicon (a-Si), poly-crystalline Silicon (p-Si), hexathiophene, or polythiophene. That is, the present disclosure is applicable to a transistor that is manufactured based on an oxide technology, a silicon technology, or an organic matter technology.

In an exemplary implementation, after manufacturing of the drive circuit layer is completed, a light emitting structure layer and an encapsulation structure layer may be sequentially manufactured on the drive circuit layer, which will not be repeated herein.

As can be seen from the structure and manufacturing process of the display substrate described above, in an embodiment of the present disclosure, the fourth transistor T4 is controlled by the first scan signal line 21, the second transistor T2 is controlled by the second scan signal line 22, and the second storage capacitor is disposed in the pixel drive circuit, so that the data writing time stage and the threshold compensation time stage are separated, which can not only prolong the data writing time length, but also ensure sufficient compensation time length, effectively improve the problems of insufficient charging time length and insufficient compensation time length in the existing scheme, ensure a clearer definition of different grayscale pictures, ensure an image quality of a high frequency display, and improve the display effect and the display quality.

In the present disclosure, a first initial signal line and a second initial signal line whose main body portions extend along the first direction are disposed in the second conductive layer, a first connection line and a second connection line whose main body portions extend along the second direction are disposed in the fourth conductive layer, wherein the first connection line is connected with the first initial signal line, and the second connection line is connected with the second initial signal line, so that the first initial signal line transmitting the first initial signal form a mesh structure and the second initial signal line transmitting the second initial signal form a mesh structure. Therefore, in one aspect, resistances of the first initial signal line and the second initial signal line are effectively reduced, voltage drops of the first initial voltage and the second initial voltage are reduced, uniformities of the first initial voltage and the second initial voltage in a display substrate are effectively improved, display uniformity is effectively improved, display performance and display quality are improved. In another aspect, the second node N2 can be reset in a shorter time, which is beneficial to high frequency display, and the reset time of the fourth node N4 is shorter, which is beneficial to improving the low-grayscale display effect. In the present disclosure, a first storage capacitor is formed through the first conductive layer and the second conductive layer, and two second storage capacitors with a parallel structure are formed through the semiconductor layer, the second conductive layer and the third conductive layer, thereby a capacitance value of the second storage capacitor is effectively increased, writing of data voltage can be more sufficient and a writing quality of data can be ensured. The manufacturing process in the present disclosure may be compatible well with an existing manufacturing process, is simple in process implementation, is easy to implement, and has a high production efficiency, a low production cost, and a high yield.

Figure 17:
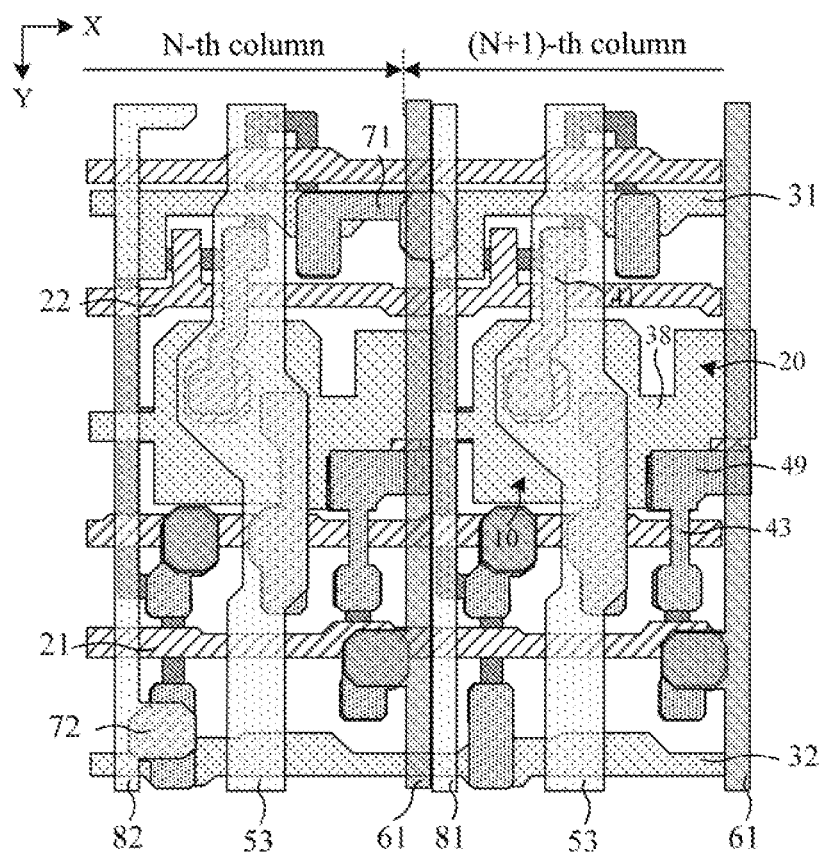
FIG. 17 illustrates a schematic diagram of a planar structure of another display substrate according to an exemplary embodiment of the present disclosure.

FIG. 17 illustrates a schematic diagram of a planar structure of another display substrate according to an exemplary embodiment of the present disclosure, illustrating a structure of pixel drive circuits in two circuit units in a display area. As shown in FIG. 17, the structure of the pixel drive circuit of this exemplary embodiment is substantially the same as that of the aforementioned embodiment, except that the second storage capacitor 20 of this embodiment is formed by a first conductive layer and a second conductive layer.

In an exemplary implementation, a first end of the first storage capacitor 10 may include a first electrode plate, and a second end of the first storage capacitor 10 may include a second electrode plate, the first electrode plate may be disposed in the first conductive layer, the second electrode plate may be disposed in the second conductive layer, and an orthographic projection of the second electrode plate on the base substrate is at least partially overlapped with an orthographic projection of the first electrode plate on the base substrate.

In an exemplary implementation, a first end of the second storage capacitor 20 may include a third electrode plate, and a second end of the second storage capacitor 20 may include a fourth electrode plate, the third electrode plate may be disposed in the first conductive layer, the fourth electrode plate may be disposed in the second conductive layer, and an orthographic projection of the fourth electrode plate on the base substrate is at least partially overlapped with an orthographic projection of the third electrode plate on the base substrate.

In an exemplary implementation, a capacitance value of the second storage capacitor 20 may be less than a capacitance value of the first storage capacitor 10.

In an exemplary implementation, the capacitance value of the second storage capacitor 20 may be about 20% to 70% of the capacitance value of the first storage capacitor 10. For example, the capacitance value of the second storage capacitor 20 may be about 30% to 50% of the capacitance value of the first storage capacitor 10.

In an exemplary implementation, the second conductive layer may further include a first electrode plate connection block 38, and the second electrode plate and the fourth electrode plate may be connected with each other through the first electrode plate connection block 38.

In an exemplary implementation, the third conductive layer may also include the third connection electrode 43 (first node) and a second electrode plate connection block 49, the third connection electrode 43 is connected with the second electrode plate connection block 49, and the second electrode plate connection block 49 is connected with the third electrode plate through a via.

In an exemplary implementation, the manufacturing process of the display substrate may include following acts.

Figure 18:
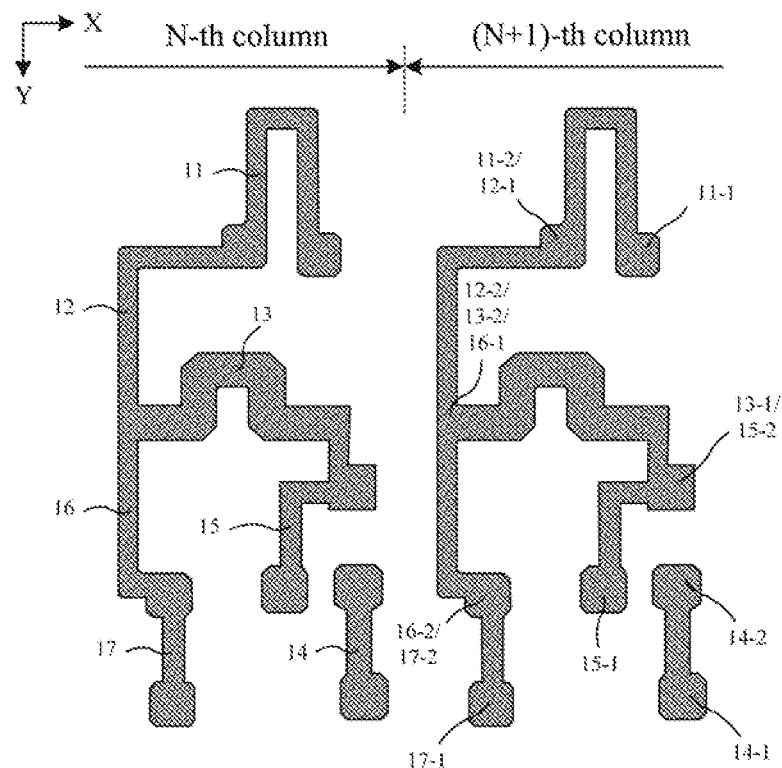
FIG. 18 is a schematic diagram of another display substrate after a pattern of a semiconductor layer is formed according to the present disclosure.

(21) A pattern of a semiconductor layer is formed. In an exemplary implementation, forming the pattern of the semiconductor layer may include: a first insulating thin film and a semiconductor thin film are deposited sequentially on a base substrate, and the semiconductor thin film is patterned through a patterning process to form a first insulating layer that covers the base substrate and the semiconductor layer disposed on the first insulating layer, as shown in FIG. 18.

In an exemplary implementation, the semiconductor layer of each circuit unit in the display area may at least include a first active layer 11 of a first transistor T1, a second active layer 12 of a second transistor T2, a third active layer 13 of a third transistor T3, a fourth active layer 14 of a fourth transistor T4, a fifth active layer 15 of a fifth transistor T5, a sixth active layer 16 of a sixth transistor T6, and a seventh active layer 17 of a seventh transistor T7.

In the exemplary implementation, the structure and connection relationship of the first active layer 11 to the seventh active layer 17 are substantially the same as those of the aforementioned embodiments, except that a third electrode plate is not connected with the first region 13-1 of the third active layer and the second region 15-2 of the fifth active layer since no third electrode plate is formed on the semiconductor layer.

Figure 19:
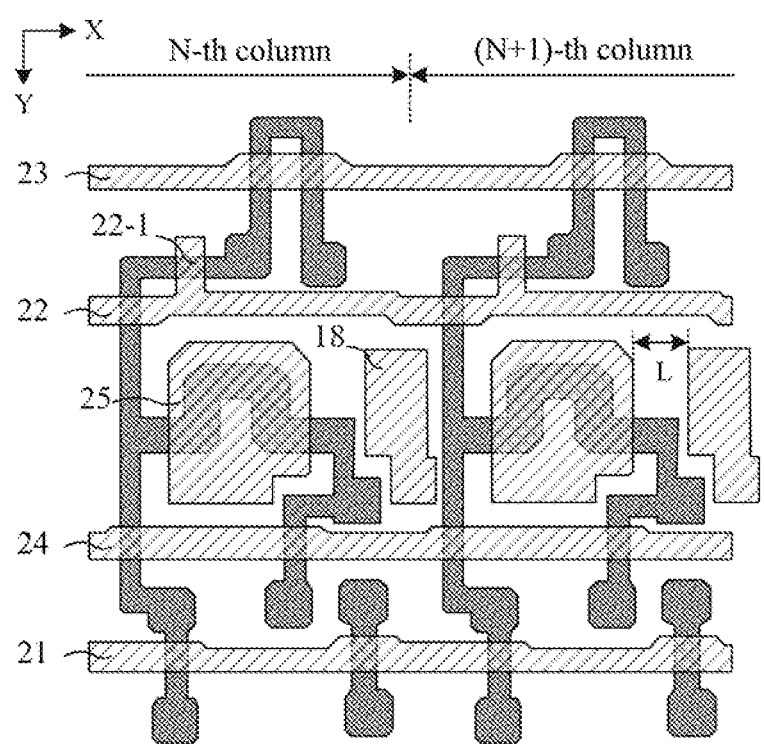
FIG. 19 is a schematic diagram of another display substrate after a pattern of a first conductive layer is formed according to the present disclosure.

(22) A pattern of a first conductive layer is formed. In an exemplary implementation, forming the pattern of the first conductive layer may include: a second insulating thin film and a first conductive thin film are sequentially deposited on the base substrate on which the aforementioned patterns are formed, and the first conductive thin film is patterned through a patterning process to form a second insulating layer that covers the pattern of the semiconductor layer, and a pattern of a first conductive layer disposed on the second insulating layer, as shown in FIG. 19.

In an exemplary implementation, the pattern of the first conductive layer of each circuit unit in the display area at least includes: a first scan signal line 21, a second scan signal line 22, a third scan signal line 23, a light emitting control line 24, a first electrode plate 25 of a first storage capacitor and a third electrode plate 18 of the second storage capacitor.

In the exemplary implementation, the structure and connection relationships of the first scan signal line 21, the second scan signal line 22, the third scan signal line 23, the light emitting control line 24, and the first electrode plate 25 of the first storage capacitor are substantially the same as those of the aforementioned embodiments.

In an exemplary implementation, a shape of the third electrode plate 18 of the second storage capacitor may be a rectangular shape, and chamfers may be provided at corners of the rectangle. The third electrode plate 18 of the second storage capacitor may be disposed on a side of the first electrode plate 25 in the first direction X, and the third electrode plate 18 may serve as an electrode plate of the second storage capacitor.

In an exemplary implementation, a spacing L between the first electrode plate 25 and the third electrode plate 18 may be greater than or equal to 2 µm, and the spacing L may be a size in the first direction X (unit row direction). For example, the spacing L may be about 2.5 µm.

In an exemplary implementation, an area of an orthographic projection of the third electrode plate 18 on the base substrate may be smaller than an area of an orthographic projection of the first electrode plate 25 on the base substrate.

In an exemplary implementation, a size of the first electrode plate 25 in the second direction Y of this embodiment is greater than a size of the first electrode plate 25 in the second direction Y of the aforementioned embodiment, leaving a greater surplus space for the second storage capacitor on the premise of ensuring a capacitance value of the first storage capacitor.

Figure 20:
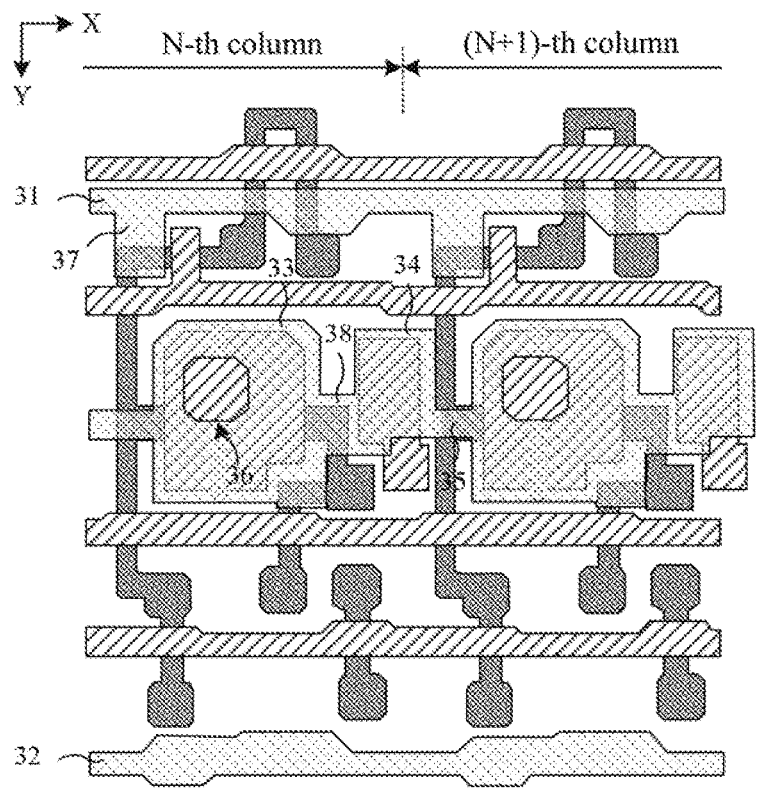
FIG. 20 is a schematic diagram of another display substrate after a pattern of a second conductive layer is formed according to the present disclosure.

(23) A pattern of a second conductive layer is formed. In an exemplary implementation, forming the pattern of the second conductive layer may include: a third insulating thin film and a second conductive thin film are sequentially deposited on the base substrate on which the aforementioned patterns are formed, and the second conductive thin film is patterned through a patterning process to form a third insulating layer that covers the first conductive layer, and the pattern of the second conductive layer disposed on the third insulating layer, as shown in FIG. 20.

In an exemplary implementation, the pattern of the second conductive layer of each circuit unit in the display area at least includes: a first initial signal line 31, a second initial signal line 32, a second electrode plate 33 of the first storage capacitor, a fourth electrode plate 34 of the second storage capacitor, an electrode plate connection line 35, a shielding electrode 37 and a first electrode plate connection block 38.

In an exemplary implementation, the structure and connection relationships of the first initial signal line 31, the second initial signal line 32, the second electrode plate 33, the fourth electrode plate 34, the electrode plate connection line 35 and the shielding electrode 37 are substantially the same as those of the aforementioned embodiments, except that the second electrode plate 33 of the first storage capacitor and the fourth electrode plate 34 of the second storage capacitor are connected with each other through the first electrode plate connection block 38, so that the second electrode plate 33, the fourth electrode plate 34 and the first electrode plate connection block 38 in the circuit unit are of an interconnected integral structure.

In an exemplary implementation, an area of an orthographic projection of the fourth electrode plate 34 on the base substrate may be smaller than an area of an orthographic projection of the first electrode plate 25 on the base substrate, and the area of the orthographic projection of the fourth electrode plate 34 on the base substrate may be smaller than an area of an orthographic projection of the second electrode plate 33 on the base substrate.

In an exemplary implementation, a capacitance value of the second storage capacitor may be less than a capacitance value of the first storage capacitor.

In an exemplary implementation, the capacitance value of the second storage capacitor may be about 20% to 70% of the capacitance value of the first storage capacitor. For example, the capacitance value of the second storage capacitor 20 may be about 30% to 50% of the capacitance value of the first storage capacitor 10.

Figure 21:
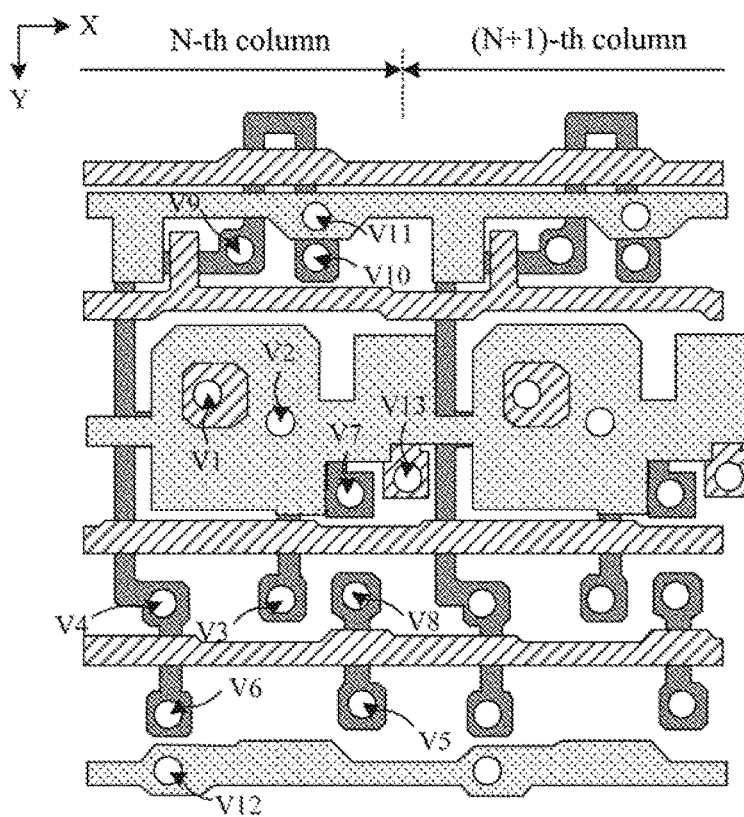
FIG. 21 is a schematic diagram of another display substrate after a pattern of a fourth insulating layer is formed according to the present disclosure.

(24) A pattern of a fourth insulating layer is formed. In an exemplary implementation, forming the pattern of the fourth insulating layer may include: a fourth insulating thin film is deposited on the base substrate on which the aforementioned patterns are formed, and the fourth insulating thin film is patterned through a patterning process, to form a fourth insulating layer that covers the second conductive layer, wherein multiple vias are disposed on each circuit unit, as shown in FIG. 21.

In an exemplary implementation, multiple vias of each circuit unit in the display area at least include: a first via V1, a second via V2, a third via V3, a fourth via V4, a fifth via V5, a sixth via V6, a seventh via V7, an eighth via V8, a ninth via V9, a tenth via V10, an eleventh via V11, a twelfth via V12, and a thirteenth via V13.

In an exemplary implementation, the structure and connection relationships of the first via V1 to the twelfth via V12 are substantially the same as those of the aforementioned embodiments. An orthographic projection of the thirteenth via V13 on the base substrate is located within a range of an orthographic projection of the third electrode plate 18 on the base substrate, the fourth insulating layer and the third insulating layer within the thirteenth via V13 are etched away to expose a surface of the third electrode plate 18, and the thirteenth via V13 is configured such that the second electrode plate connection block formed subsequently is connected with the third electrode plate 18 through the thirteenth via.

Figure 22:
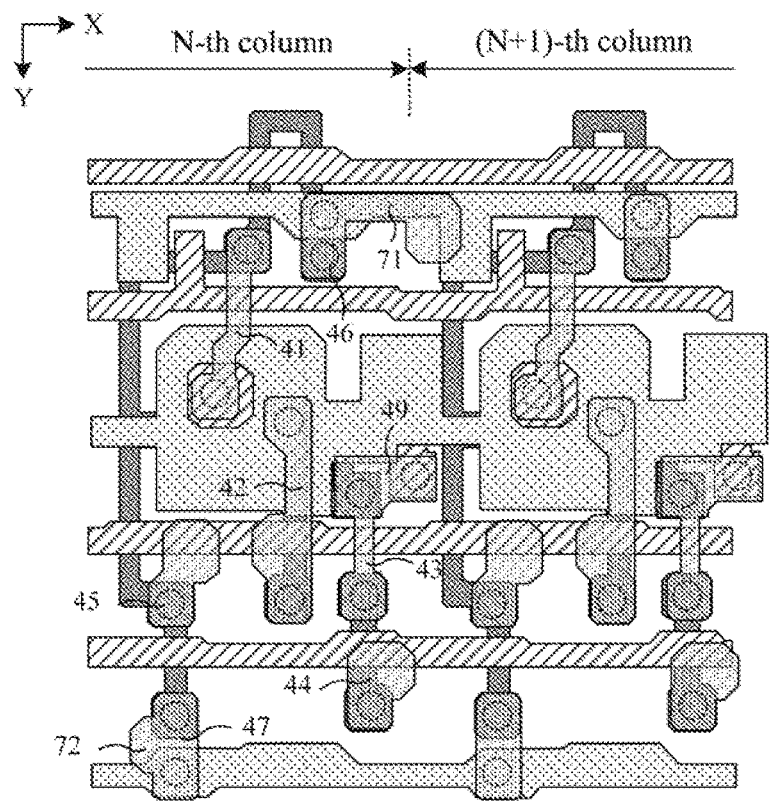
FIG. 22 is a schematic diagram of another display substrate after a pattern of a third conductive layer is formed according to the present disclosure.

(25) A pattern of a third conductive layer is formed. In an exemplary implementation, forming the third conductive layer may include: a third conductive thin film is deposited on the base substrate on which the aforementioned patterns are formed, the third conductive thin film is patterned through a patterning process to form the third conductive layer disposed on the fourth insulating layer, as shown in FIG. 22.

In an exemplary implementation, the pattern of the third conductive layer of each circuit unit in the display area each may include: a first connection electrode 41, a second connection electrode 42, a third connection electrode 43, a fourth connection electrode 44, a fifth connection electrode 45, a sixth connection electrode 46, and a seventh connection electrode 47 and a second electrode plate connection block 49.

In an exemplary implementation, the structure and connection relationships of the first connection electrode 41 to the seventh connection electrode 47 are substantially the same as those of the aforementioned embodiments, except that the third connection electrode 43 is connected with the second electrode plate connection block 49.

In an exemplary implementation, a shape of the second electrode plate connection block 49 may be a rectangular shape, the second electrode plate connection block 49 may be located on a side of the third connection electrode 43 of the present circuit unit in the first direction X (a side away from the first storage capacitor), an orthographic projection of the second electrode plate connection block 49 on the base substrate is at least partially overlapped with an orthographic projection of the third electrode plate 18 on the base substrate, a first end of the second electrode plate connection block 49 is connected with the third connection electrode 43, and a second end of the second electrode plate connection block 49 extends along the first direction X and then is connected with the third electrode plate 18 through the thirteenth via V13.

In an exemplary implementation, the third connection electrode 43 and the second electrode plate connection block 49 may be of an interconnected integral structure. Since the third connection electrode 43 serves as the first node N1 in the pixel drive circuit, the third electrode plate 18 connected with the third connection electrode 43 through the second electrode plate connection block 49 has a potential of the first node N1, and the third electrode plate 18 and the fourth electrode plate 34 constitute the second storage capacitor of the pixel drive circuit.

In an exemplary implementation, the pattern of the third conductive layer of at least one circuit unit may further include a first initial electrode 71 and a second initial electrode 72, and the structure and connection relationships of the first initial electrode 71 and the second initial electrode 72 are substantially the same as those of the aforementioned embodiments.

Figure 23:
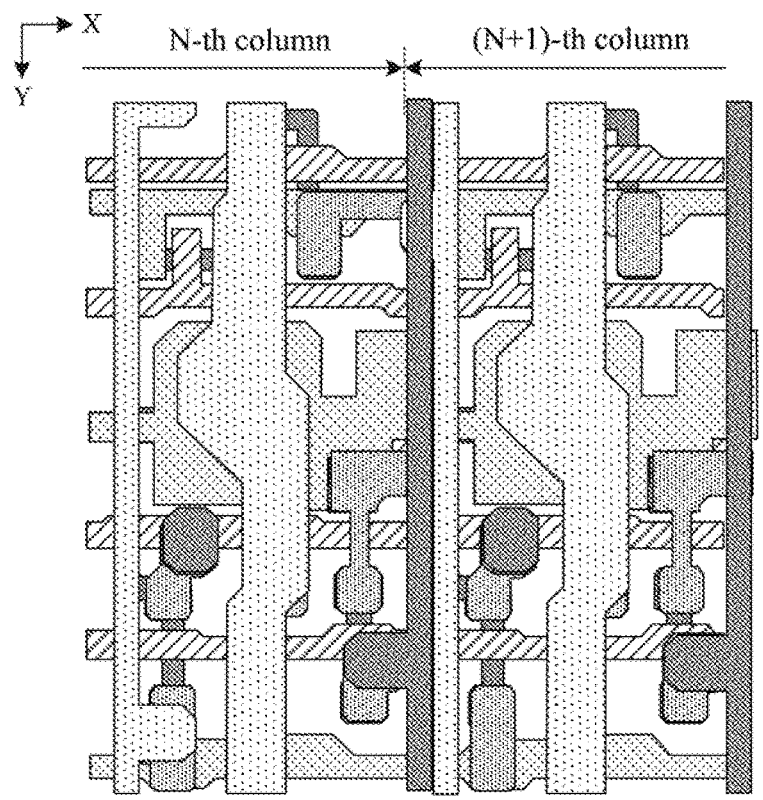
FIG. 23 is a schematic diagram of another display substrate after a pattern of a fifth conductive layer is formed according to the present disclosure.

(26) A pattern of a fifth insulating layer, a pattern of a fourth conductive layer, a pattern of a first planarization layer, a pattern of a fifth conductive layer, and a pattern of a second planarization layer are sequentially formed, as shown in FIG. 23. In an exemplary implementation, the manufacturing process and related structures are substantially the same as those of the aforementioned embodiments, which will not be repeated herein.

According to the display substrate provided by an exemplary embodiment, on one aspect, separation of the data writing time stage and the threshold compensation time stage is realized, which prolongs the data writing time length and the compensation time length, the problems of insufficient charging time length and insufficient compensation time length in the existing scheme are effectively improved; on another aspect, mesh structures for transmitting the first initial signal and (a mesh structure for transmitting) the second initial signal are formed simultaneously, a voltage drop is reduced and display uniformity is improved; on yet another aspect, the first storage capacitor and the second storage capacitor are simultaneously formed through the first conductive layer and the second conductive layer, which occupies a small space, is beneficial to increasing a capacitance value of the second storage capacitor and improving the stability of a potential of the first node N1. The second storage capacitor is formed by two layers of metal in the present disclosure, which is beneficial to planarization of the third conductive layer, the fourth conductive layer and the fifth conductive layer, and avoids an influence of process fluctuation on a capacitance value of the storage capacitor.

The aforementioned structure shown in the present disclosure and the manufacturing process therefor are merely exemplary description. In an exemplary implementation, corresponding structures may be changed and patterning processes may be added or reduced according to actual needs, which is not limited here in the present disclosure.

In an exemplary implementation, the display substrate according to the present disclosure may be applied to a display device with a pixel drive circuit, such as an OLED, a quantum dot display (QLED), a light emitting diode display (Micro LED or Mini LED), or a Quantum Dot Light Emitting Diode display (QDLED), etc., which is not limited here in the present disclosure.

In an exemplary implementation, a bezel area of the display substrate may be at least provided with multiple cascaded gate driver on arrays (GOA), and each of gate driver on arrays is connected with a first scan signal line, a second scan signal line, a third scan signal line and a light emitting signal line in each unit row.

In an exemplary implementation, at least one gate driver on array may at least include a first gate circuit group, a second gate circuit group, and a third gate circuit group. The first gate circuit group may be respectively connected with the first scan signal line and the third scan signal line, the second gate circuit group may be connected with the second scan signal line, and the third gate circuit group may be connected with the light emitting signal line, i.e., the first scan signal line and the third scan signal line are driven by one gate circuit group, and the second scan signal line is driven by another gate circuit group.

In an exemplary implementation, the first gate circuit group, the second gate circuit group, and the third gate circuit group may employ bilateral simultaneous drive, or may employ unilateral drive, to meet narrow bezel requirements, which is not limited here in the present disclosure.

In an exemplary implementation, the second gate circuit group may adopt a one-for-two structure configuration, i.e. one second gate circuit group may be connected with the second scan signal lines of the two unit rows to control the turned on or the turned off of multiple second transistors T2 in the two unit rows to reduce a quantity of gate driver on arrays and a quantity of wires in the bezel area, which is beneficial to achieving a narrow bezel.

Figure 24:
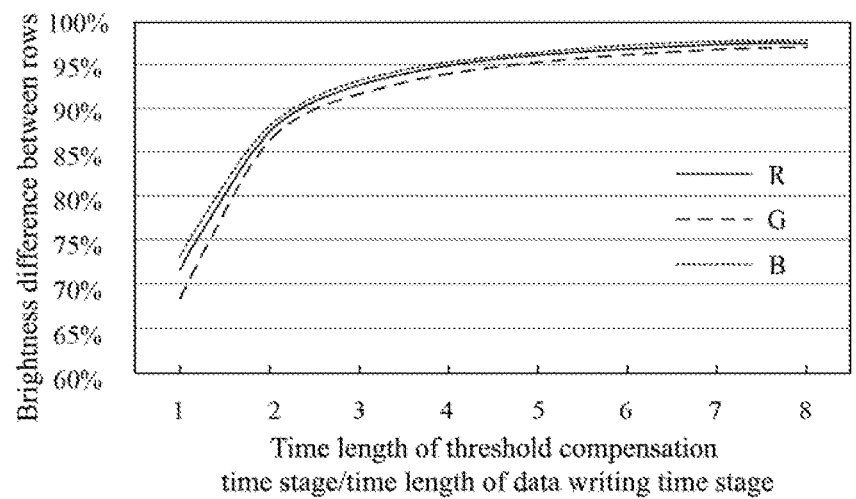
FIG. 24 is a test result diagram of brightness difference between rows when the one-for-two structure is adopted according to the present disclosure.

FIG. 24 is a test result diagram of brightness difference between rows when the one-for-two structure is adopted according to the present disclosure. As shown in FIG. 24, the second gate circuit group adopts a one-for-two structure configuration, and at grayscales of 32 and 500 nits, when the time length of the threshold compensation time stage is greater than or equal to four times the time length of the data writing time stage (n=4), the brightness difference between rows is greater than 95%. By increasing the time length of threshold compensation time stage, the present disclosure can solve the problem of brightness difference between rows in the existing one-for-two structure.

Figure 25:
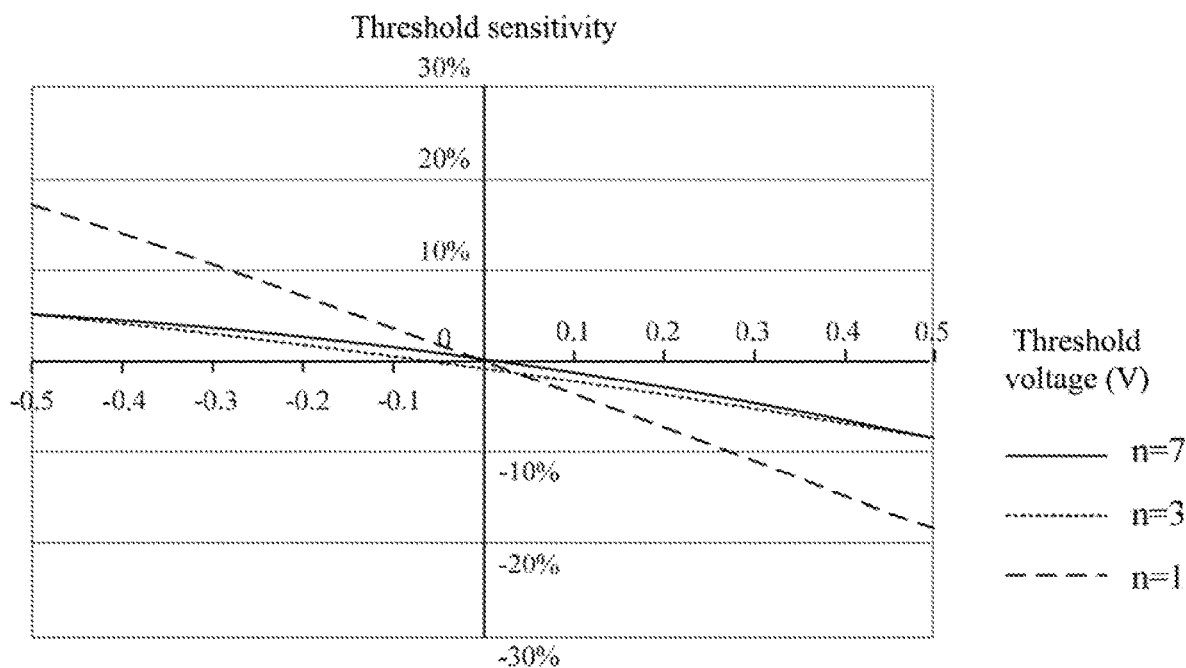
FIG. 25 is a test result diagram of threshold sensitivities at different threshold compensation stage time lengths according to the present disclosure.

FIG. 25 is a test result diagram of threshold sensitivities at different threshold compensation stage time lengths according to the present disclosure. As shown in FIG. 25, when a time length of a threshold compensation time stage is equal to a time length of the data writing time stage (n=1), the threshold sensitivity (Vth Sensitivity) is large, and when the time length of the threshold compensation time stage is 3 times (n=3) and 7 times (n=7) the time length of the data writing time stage, the threshold sensitivities are obviously reduced, and the compensation effect can be improved.

In an exemplary implementation, when the time length of the threshold compensation time stage is about 9 times the time length of the data writing time stage, the brightness difference between rows and change of threshold sensitivity are small. Considering factors, such as a refresh rate, the time length of the threshold compensation time stage is set to be n times the time length of the data writing time stage in the present disclosure, where n is a positive integer greater than or equal to 1 and less than or equal to 9. For example, the time length of the threshold compensation time stage is 3 times, 5 times or 7 times the time length of the data writing time stage.

The present disclosure also provides a method for driving a display substrate, for driving the display substrate according to the aforementioned embodiments. In an exemplary implementation, the display substrate includes multiple circuit units constituting multiple unit rows and multiple unit columns, at least one circuit unit includes a pixel drive circuit, the pixel drive circuit at least includes a compensation transistor, a drive transistor, a data writing transistor, a first node, a second node, a first storage capacitor and a second storage capacitor, and the pixel drive circuit are connected with a first scan signal line, a second scan signal line, a first power supply line and a data signal line, respectively; a gate electrode of the drive transistor is connected with the second node, a first electrode of the drive transistor is connected with the first node, and a second electrode of the drive transistor is connected with a second electrode of the compensation transistor; a gate electrode of the data writing transistor is connected with the first scan signal line, a first electrode of the data writing transistor is connected with the data signal line, and a second electrode of the data writing transistor is connected with the first node; a gate electrode of the compensation transistor is connected with the second scan signal line, and the first electrode of the compensation transistor is connected with the second node; a first end of the first storage capacitor is connected with the second node, and a second end of the first storage capacitor is connected with the first power supply line; a first end of the second storage capacitor is connected with the first node, and a second end of the second storage capacitor is connected with the first power supply line. The driving method may include: during a data writing time stage, the first scan signal line and the second scan signal line output turned-on signals, the compensation transistor and the data writing transistor are turned on, and the data voltage output by the data signal line is written into the first storage capacitor and the second storage capacitor; and during a threshold compensation time stage, the first scan signal line outputs a turned-off signal and the second scan signal line outputs a turned-on signal, the compensation transistor is turned on, the data writing transistor is turned off, the data voltage stored in the second storage capacitor is written into the first storage capacitor, and threshold compensation is performed on the drive transistor.

In an exemplary implementation, a time length of the threshold compensation time stage is greater than or equal to a time length of the data writing time stage.

In an exemplary implementation, the time length of the threshold compensation time stage is n times the time length of the data writing time stage, where n is a positive integer greater than or equal to 1 and less than or equal to 9.

The present disclosure also provides a display device which includes the aforementioned display substrate. The display device may be any product or component with a display function, such as a mobile phone, a tablet computer, a television, a display, a laptop computer, a digital photo frame, or a navigator, which is not limited in the embodiments of the present invention.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementations without departing from the spirit and scope of the present disclosure. However, the patent protection scope of the present invention should be subject to the scope defined by the appended claims.

The invention claimed is:

1. A display substrate, comprising a plurality of circuit units constituting a plurality of unit rows and a plurality of unit columns, wherein at least one circuit unit comprises a pixel drive circuit, the pixel drive circuit at least comprises a compensation transistor, a drive transistor, a data writing transistor, a first node, a second node, a first storage capacitor and a second storage capacitor, the pixel drive circuit is connected with a first scan signal line, a second scan signal line, a first power supply line and a data signal line, respectively; a gate electrode of the drive transistor is connected with the second node, a first electrode of the drive transistor is connected with the first node, and a second electrode of the drive transistor is connected with a second electrode of the compensation transistor; a gate electrode of the data writing transistor is connected with the first scan signal line, a first electrode of the data writing transistor is connected with the data signal line, and a second electrode of the data writing transistor is connected with the first node; a gate electrode of the compensation transistor is connected with the second scan signal line, and a first electrode of the compensation transistor is connected with the second node; a first end of the first storage capacitor is connected with the second node, and a second end of the first storage capacitor is connected with the first power supply line; a first end of the second storage capacitor is connected with the first node, and a second end of the second storage capacitor is connected with the first power supply line;

wherein on a plane perpendicular to the display substrate, the display substrate comprises a semiconductor layer, a first conductive layer, a second conductive layer, and a third conductive layer which are disposed sequentially on a base substrate; the first end of the first storage capacitor comprises a first electrode plate, the second end of the first storage capacitor comprises a second electrode plate, the first electrode plate is disposed in the first conductive layer, and the second electrode plate is disposed in the second conductive layer; the first end of the second storage capacitor at least comprises a third electrode plate, the second end of the second storage capacitor comprises a fourth electrode plate, the third electrode plate is disposed in the semiconductor layer, and the fourth electrode plate is disposed in the second conductive layer.

2. The display substrate according to claim 1, wherein the first end of the second storage capacitor further comprises a fifth electrode plate, the fifth electrode plate is disposed in the third conductive layer, and the third electrode plate is connected with the fifth electrode plate.

3. The display substrate according to claim 2, wherein the first node is disposed in the third conductive layer, the first node and the fifth electrode plate are an interconnected integral structure, and the first node is connected with the third electrode plate through a via.

4. The display substrate according to claim 1, wherein the semiconductor layer further comprises an active layer of the drive transistor, and the third electrode plate and the active layer of the drive transistor are an interconnected integral structure.

5. The display substrate according to claim 1, wherein the second electrode plate and the fourth electrode plate are an interconnected integral structure.

6. The display substrate according to claim 1, wherein the second conductive layer further comprises a first electrode plate connection block, and the second electrode plate and the fourth electrode plate are connected with each other through the first electrode plate connection block.

7. The display substrate according to claim 1, wherein the third conductive layer further comprises a second electrode plate connection block and the first node, the first node is connected with the second electrode plate connection block, the second electrode plate connection block is connected with the third electrode plate through a via.

8. The display substrate according to claim 1, wherein a spacing between the first electrode plate and the third electrode plate is greater than or equal to 2 μm, and the spacing is a dimension in a direction of a unit row.

9. The display substrate according to claim 8, wherein a capacitance value of the second storage capacitor is 20% to 70% of the capacitance value of the first storage capacitor.

10. The display substrate according to claim 1, wherein a capacitance value of the second storage capacitor is less than a capacitance value of the first storage capacitor.

11. The display substrate according to claim 1, wherein the pixel drive circuit is further connected with a first initial signal line and a second initial signal line respectively, shapes of the first initial signal line and the second initial signal line are line shapes extending along a first direction; the first initial signal line is connected with a first connection line extending along a second direction to form a mesh structure for transmitting a first initial signal, the second initial signal line is connected with a second connection line extending along the second direction to form a mesh structure for transmitting a second initial signal, and the first direction intersects with the second direction.

12. The display substrate according to claim 11, wherein the first initial signal line and the second initial signal line are disposed in circuit units of at least one unit row; first connection lines are disposed in circuit units of odd-numbered unit columns, and second connection lines are disposed in circuit units of even-numbered unit columns, or first connection lines are disposed in circuit units of even-numbered unit columns and second connection lines are disposed in circuit units of odd-numbered unit columns.

13. The display substrate according to claim 11, wherein on a plane perpendicular to the display substrate, the display substrate further comprises a fourth conductive layer disposed subsequently on a side of the third conductive layer away from the base substrate; the first initial signal line and the second initial signal line are disposed in the second conductive layer, and the first connection line and the second connection line are disposed in the fourth conductive layer.

14. The display substrate according to claim 13, wherein the third conductive layer in at least one circuit unit further comprises a first initial electrode, the first connection line is connected with the first initial electrode through a via, and the first initial electrode is connected with the first initial signal line through a via;

or the third conductive layer in at least one circuit unit further comprises a second initial electrode, the second connection line is connected with the second initial electrode through a via, and the second initial electrode is connected with the second initial signal line through a via.

15. The display substrate according to claim 13, wherein the display substrate further comprises a fifth conductive layer disposed on a side of the fourth conductive layer away from the base substrate, the data signal line is disposed in the fifth conductive layer, an orthographic projection of at least one data signal line on the base substrate is at least partially overlapped with an orthographic projection of the first connection line on the base substrate, and an orthographic projection of at least one data signal line on the base substrate is at least partially overlapped with an orthographic projection of the second connection line on the base substrate.

16. A display device, comprising the display substrate according to claim 1.

17. A method for driving the display substrate according to claim 1, comprising:

during a data writing time stage, outputting, by the first scan signal line and the second scan signal line, a turned-on signal, wherein the compensation transistor and the data writing transistor are turned on, and writing a data voltage output by the data signal line into the first storage capacitor and the second storage capacitor; and during a threshold compensation time stage, outputting, by the first scan signal line, a turned-off signal, and outputting, by the second scan signal line, a turned-on signal, wherein the compensation transistor is turned on, the data writing transistor is turned off, writing the data voltage stored in the second storage capacitor into the first storage capacitor, and performing threshold compensation on the drive transistor;

wherein a time length of the threshold compensation time stage is greater than or equal to a time length of the data writing time stage;

the time length of the threshold compensation time stage is n times the time length of the data writing time stage, wherein n is a positive integer greater than or equal to 1 and less than or equal to 9.

\* \* \* \* \*